(12) United States Patent
Ueda et al.

(10) Patent No.: US 11,101,012 B2
(45) Date of Patent: Aug. 24, 2021

(54) MAGNETIC STORAGE DEVICE

(71) Applicant: TOSHIBA MEMORY CORPORATION, Tokyo (JP)

(72) Inventors: Yoshihiro Ueda, Yokohama Kanagawa (JP); Shinji Miyano, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,868

(22) Filed: Sep. 3, 2019

(65) Prior Publication Data

US 2020/0303027 A1 Sep. 24, 2020

(30) Foreign Application Priority Data

Mar. 20, 2019 (JP) .............................. JP2019-052868

(51) Int. Cl.
*G11C 19/08* (2006.01)
*G11C 11/16* (2006.01)

(52) U.S. Cl.
CPC ...... *G11C 19/0841* (2013.01); *G11C 19/0833* (2013.01); *G11C 11/161* (2013.01)

(58) Field of Classification Search
CPC ............................ G11C 19/0841; G11C 11/161
USPC .................................................. 365/158, 173
See application file for complete search history.

(56) References Cited

U.S. PATENT DOCUMENTS

| | | | |
|---|---|---|---|
| 6,898,132 B2 | 5/2005 | Parkin | |
| 7,626,844 B1 * | 12/2009 | Moriya | G11C 19/0841 365/158 |
| 7,859,881 B2 | 12/2010 | Iwata et al. | |
| 8,830,742 B2 * | 9/2014 | Kondo | G11C 11/161 365/173 |
| 9,293,696 B2 | 3/2016 | Ootera et al. | |
| 9,871,076 B2 | 1/2018 | Toh et al. | |
| 2015/0380638 A1 | 12/2015 | Ootera et al. | |
| 2019/0287593 A1 | 9/2019 | Ueda | |
| 2020/0082863 A1 | 3/2020 | Ueda et al. | |
| 2020/0082865 A1 | 3/2020 | Ueda | |

FOREIGN PATENT DOCUMENTS

JP 2016009806 A 1/2016

* cited by examiner

*Primary Examiner* — Jason Lappas
(74) *Attorney, Agent, or Firm* — Kim & Stewart LLP

(57) ABSTRACT

A magnetic storage device includes a magnetic body including first and second magnetic regions and a magnetic connection region that connects the first and second magnetic regions, and in which a plurality of magnetic domains each storing information by a magnetization direction thereof is formed, a read element that is electrically connected to the magnetic connection region and by which a magnetization direction of one of the magnetic domains is read, and a write element by which a magnetic domain having a magnetization direction is formed in the magnetic body according to information to be stored. The magnetic domains formed in each of the first and second magnetic regions are shifted in a predetermined direction in response to current that flows through the corresponding one of the first and second magnetic regions.

11 Claims, 19 Drawing Sheets

MAGNETIC STORAGE DEVICE

CROSS-REFERENCE TO RELATED APPLICATION(S)

This application is based upon and claims the benefit of priority from Japanese Patent Application No. 2019-052868, filed on Mar. 20, 2019, the entire contents of which are incorporated herein by reference.

FIELD

Embodiments described herein relate generally to a magnetic storage device.

BACKGROUND

A magnetic body causes a phenomenon called domain wall shift in which a domain wall of a thin line moves in the longitudinal direction in response to current flowing therethrough. A memory device that incorporates domain wall motion has been proposed. In this memory device, a large number of magnetic domains are stored in a magnetic body formed on a substrate according to the principle of domain wall shift.

In addition, such a memory device may have a large number of magnetic bodies formed on a substrate. For example, a plurality of holes are formed in the direction penetrating the substrate, and ferromagnetic material is deposited on the inner side surface of each of the plurality of formed holes. By such a method, a plurality of magnetic bodies are formed in one substrate. The magnetic bodies formed as described above can hold a plurality of magnetic domains in the direction penetrating the substrate. Thus, such a memory device achieves not only high in-plane storage density but also high vertical storage density.

The memory device that incorporates domain wall motion includes a write element, a read element, and a switch for each of the plurality of magnetic bodies. In addition, the memory device includes a large number of wires. Thus, the recording density of the memory device depends on how the elements included therein are arranged.

DETAILED DESCRIPTION

Figure 1:
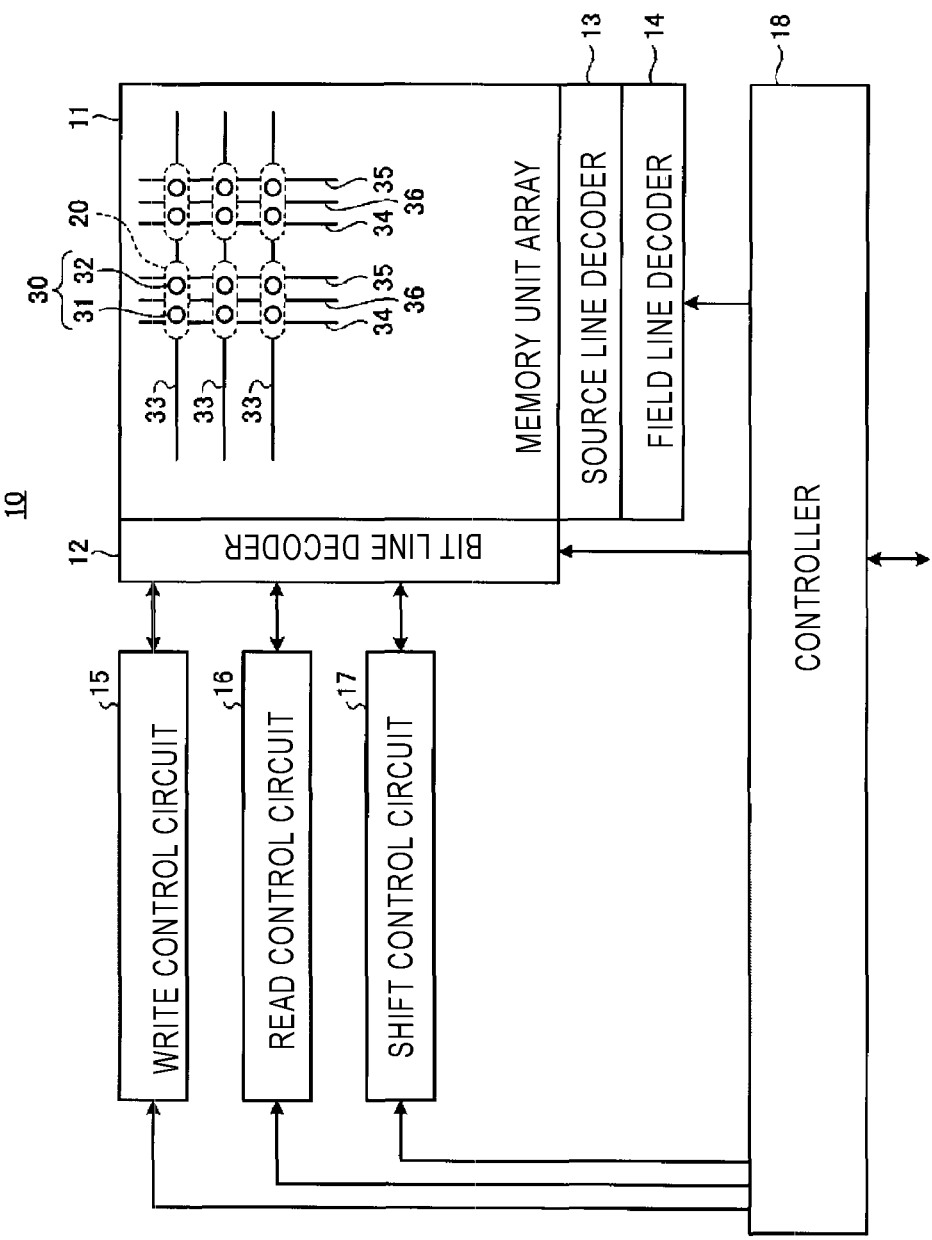
FIG. 1 is a schematic diagram illustrating a magnetic storage device according to one embodiment.

In general, according to one embodiment, a magnetic storage device includes a magnetic body including first and second magnetic regions and a magnetic connection region that connects the first and second magnetic regions, and in which a plurality of magnetic domains each storing information by a magnetization direction thereof is formed, a read element that is electrically connected to the magnetic connection region and by which a magnetization direction of one of the magnetic domains is read, and a write element by which a magnetic domain having a magnetization direction is formed in the magnetic body according to information to be stored. The magnetic domains formed in each of the first and second magnetic regions are shifted in a predetermined direction in response to current that flows through the corresponding one of the first and second magnetic regions.

Hereinafter, embodiments will be described with reference to the drawings. In the following description, the same reference numerals will be given to constituent elements having the same functions and configurations. In addition, each embodiment illustrated below exemplifies a device or a method for embodying the technical idea of this embodiment, and for example, the materials, shapes, structures, and arrangements of parts are not specified as follows.

FIG. 1 is a schematic diagram illustrating a magnetic storage device 10 according to one embodiment. The magnetic storage device 10 is implemented by a semiconductor device. The magnetic storage device 10 is called, for example, a memory device that incorporates domain wall motion.

The magnetic storage device 10 is connected to an information processing circuit, for example, via a bus and the like. The magnetic storage device 10 stores therein information received from the information processing circuit in response to an instruction from the information processing circuit. In addition, the magnetic storage device 10 outputs the information stored therein to the information processing circuit in response to an instruction from the information processing circuit.

The magnetic storage device 10 includes a memory unit array 11, a bit line decoder 12, a source line decoder 13, a field line decoder 14, a write control circuit 15, a read control circuit 16, a shift control circuit 17, and a controller 18.

The memory unit array 11 includes a plurality of memory units 20 arranged on a substrate to correspond to a two-dimensional matrix. Each of the plurality of memory units 20 includes a magnetic body pair 30 which magnetically stores information. The magnetic body pair 30 includes a first magnetic body 31 and a second magnetic body 32. The first magnetic body 31 and the second magnetic body 32 may hold a large number of magnetic domains in a predetermined direction according to the principle of domain wall shift. For example, the first magnetic body 31 and the second magnetic body 32 may have an elongated shape, and may hold a large number of magnetic domains in a direction along the longitudinal direction.

Moreover, the memory unit array 11 further includes a plurality of bit lines 33, a plurality of first source lines 34, a plurality of second source lines 35, and a plurality of field lines 36. The plurality of bit lines 33 are provided on the substrate to correspond to a plurality of rows in the matrix in a one-to-one ratio. Each of the plurality of bit lines 33 is electrically connected to one or more memory units 20 in a corresponding row.

The plurality of first source lines 34, the plurality of second source lines 35, and the plurality of field lines are provided on the substrate to correspond to a plurality of columns of the plurality of memory units 20 in the matrix in a one-to-one ratio. Each of the plurality of first source lines 34 is electrically connected to one or more memory units 20 in a corresponding column. Each of the plurality of field lines 36 is magnetically connected to one or more memory units 20 in a corresponding column.

The bit line decoder 12 selects the bit line 33 connected to the memory units 20 as a write target or a read target among the plurality of bit lines 33 under the control of the controller 18.

The source line decoder 13 selects the first source line 34 or the second source line 35 connected to the memory units 20 as a write target or a read target under the control of the controller 18. In addition, the source line decoder 13 selects the first source line 34 connected to the target memory units 20 among the plurality of first source lines 34 when the first magnetic body 31 is a write target or a read target. The source line decoder 13 selects the second source line 35 connected to the target memory units 20 among the plurality of second source lines 35 when the second magnetic body 32 is a write target or a read target.

The field line decoder 14 selects the field line 36 connected to the memory units 20 as a write target among the plurality of field lines 36 under the control of the controller 18.

At the time of writing, the write control circuit 15 writes information to the first magnetic body 31 or the second magnetic body 32 in the memory unit 20 as a write target under the control of the controller 18. In this case, the write control circuit 15 supplies current corresponding to the information to the field line 36 selected by the field line decoder 14 to generate an induction magnetic field, thereby magnetically writing the information to the first magnetic body 31 or the second magnetic body 32 in the target memory unit 20.

At the time of reading, the read control circuit 16 acquires the information stored in the first magnetic body 31 or the second magnetic body 32 in the memory unit 20 as a read target under the control of the controller 18. In this case, the read control circuit 16 supplies read current between the bit line 33 selected by the bit line decoder 12 and the first source line 34 or the second source line 35 selected by the source line decoder 13 to detect a resistance value, thereby acquiring the information magnetically stored in the first magnetic body 31 or the second magnetic body 32 in the target memory unit 20.

Before the time of writing or the time of reading, the shift control circuit 17 supplies shift pulse current to the first magnetic body 31 or the second magnetic body 32 included in the memory unit 20 as a read target or a write target under the control of the controller 18 to shift magnetic domains held by the first magnetic body 31 or the second magnetic body 32 in the longitudinal direction. In this case, the shift control circuit 17 supplies the shift pulse current between the bit line 33 selected by the bit line decoder 12 and the first source line 34 or the second source line 35 selected by the source line decoder 13, thereby shifting the magnetic domains held by the first magnetic body 31 or the second magnetic body 32 in the target memory unit 20.

The controller 18 receives, for example, a read command or a write command from the information processing circuit connected thereto via the bus and the like. The controller 18 controls the bit line decoder 12, the source line decoder 13, the field line decoder 14, the write control circuit 15, the read control circuit 16, and the shift control circuit 17 in response to the received command. Thus, the controller 18 may write information to or read out information from either the first magnetic body 31 or the second magnetic body 32 in the selected memory unit 20 among the plurality of memory units 20 in the memory unit array 11.

Figure 2:
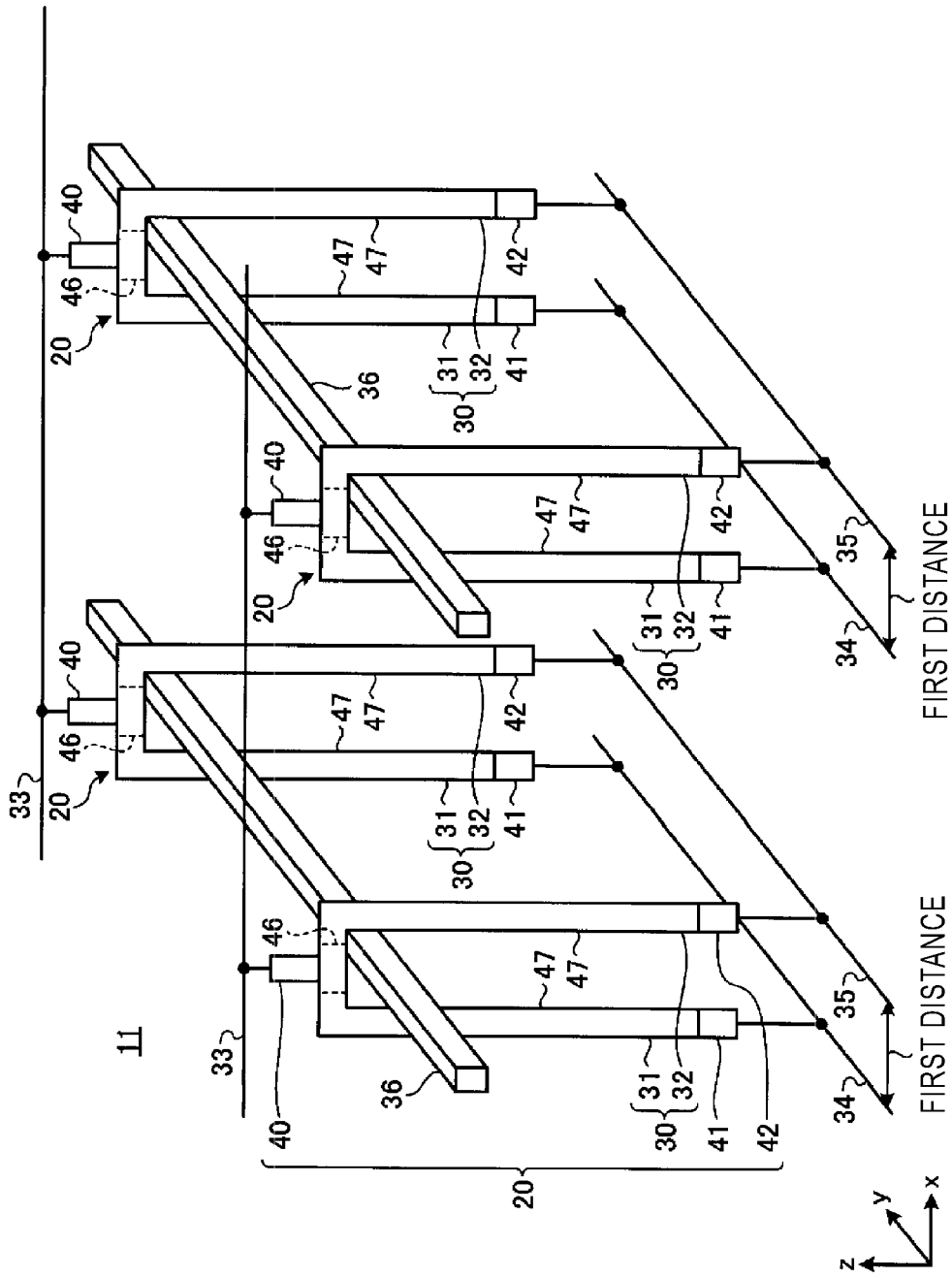
FIG. 2 is a schematic diagram illustrating structure of a memory unit array.

FIG. 2 is a schematic diagram illustrating structure of the memory unit array 11.

The plurality of memory units 20 are arranged to correspond to a two-dimensional matrix with respect to a plane on the substrate (i.e., the x-y plane in FIG. 2). Here, in the substrate, the direction corresponding to the row direction of the matrix is referred to as the x direction, and the direction corresponding to the column direction is referred to as the y direction. In addition, in the substrate, the direction penetrating the substrate is referred to as the z direction.

In addition, the x direction, the y direction, and the z direction are orthogonal to one another. That is, the x direction is orthogonal to the z direction and the y direction. In addition, the y direction is orthogonal to the z direction and the x direction.

Each of the plurality of bit lines 33 is a substantially linear wire and extends in the x direction. The plurality of bit lines 33 are equidistantly arranged in parallel.

Each of the plurality of first source lines 34 is a substantially linear wire and extends in the y direction. The plurality of first source lines 34 are equidistantly arranged in parallel. Each of the plurality of second source lines 35 is a substantially linear wire and extends in the y direction. The plurality of second source lines 35 are equidistantly arranged in parallel.

Moreover, the plurality of first source lines 34 and the plurality of second source lines 35 are formed within the same layer parallel to the substrate. The plurality of bit lines 33 are formed in a different layer from the plurality of first source lines 34 and the plurality of second source lines 35.

In addition, the plurality of first source lines 34 and the plurality of second source lines 35 are alternately arranged in the x direction, and one first source line 34 and one second source line 35 which are adjacent to each other in a given direction make a pair. The pair of first source line 34 and second source line 35 is arranged with a first distance therebetween.

Each of the plurality of field lines 36 is a substantially linear wire and extends in the y direction. The plurality of field lines 36 are equidistantly arranged in parallel.

Moreover, the plurality of field lines 36 are formed in a different layer from the plurality of bit lines 33, the plurality of first source lines 34, and the plurality of second source lines 35 in the z direction. More specifically, the plurality of field lines 36 are formed in a layer close to the bit lines 33 between the plurality of bit lines 33 and the plurality of first source lines 34 or the plurality of second source lines 35. Moreover, each of the plurality of field lines 36 is provided at a middle position in the x direction between the first source line and the second source line 35 which are formed to correspond to the same column.

Each of the plurality of memory units 20 is formed in a layer between the plurality of bit lines 33 and the plurality of first source lines 34 or the plurality of second source lines 35. Each of the plurality of memory units 20 is formed at the intersection region of the plurality of bit lines 33 and one source line pair (i.e., a pair of the first source line 34 and the second source line 35).

Each of the plurality of memory units 20 includes the magnetic body pair 30, a read element 40, a first switch 41, and a second switch 42.

The magnetic body pair 30 includes the first magnetic body 31 and the second magnetic body 32. The first magnetic body 31 and the second magnetic body 32 are linear conductive ferromagnetic bodies.

Each of the first magnetic body 31 and the second magnetic body 32 may hold a plurality of magnetic domains in a predetermined direction (e.g., a linear longitudinal direction). Each of the plurality of magnetic domains is magnetized in one of two recording directions based on stored information. Each of the first magnetic body 31 and the second magnetic body 32 shifts the magnetic domains held therein in a predetermined direction in response to a predetermined amount of shift pulse current flowing in the predetermined direction.

The first magnetic body 31 and the second magnetic body 32 are bent in the x direction at end regions thereof on the bit line 33 side and are connected to each other. The end region of the first magnetic body 31 is bent to the second magnetic body 32 side. In addition, the end region of the second magnetic body 32 is bent to the first magnetic body 31 side. Then, the first magnetic body 31 and the second magnetic body 32 are connected to each other at the end regions thereof. In addition, a magnetic body region which is a connection portion between the first magnetic body 31 and the second magnetic body 32 is referred to as a connection area 46.

In addition, a storage area 47 excluding the end region on the connection area 46 side in the first magnetic body 31 and the second magnetic body 32 is formed in a linear shape to extend in the z direction. The storage area 47 of the first magnetic body 31 and the storage area 47 of the second magnetic body 32 are arranged in parallel in the x direction with a first distance therebetween. Such a magnetic body pair 30 is substantially U-shaped as a whole.

The read element 40 is electrically connected between the connection area 46 and a corresponding bit line 33. Moreover, the read element 40 is also magnetically connected to the connection area 46 and reads the magnetization direction of a magnetic domain held by the connection area 46.

The read element 40 is, for example, a magnetoresistive element. Thus, the magnetization direction of the read element 40 changes according to the magnetization direction of the magnetic domain held by the connection area 46. Moreover, the resistance value of the read element 40 changes according to a stored magnetization direction. Thus, the read control circuit 16 may read the magnetization direction of the magnetic domain held by the connection area 46 by supplying read current which is sufficiently smaller than the shift pulse current to the read element 40. In the present embodiment, the read element 40 is a magnetic tunnel junction (MTJ) element.

The first switch 41 electrically connects or disconnects between an end region of the first magnetic body 31 opposite to the connection area 46 and a corresponding first source line 34. Thus, when the first switch 41 is in an ON state, the read control circuit 16 and the shift control circuit 17 may supply current between the first source line 34 and a corresponding bit line 33, thereby supplying the current to the read element 40 and the first magnetic body 31.

The second switch 42 electrically connects or disconnects between an end region of the second magnetic body 32 opposite to the connection area 46 and a corresponding second source line 35. Thus, when the second switch 42 is in an ON state, the read control circuit 16 and the shift control circuit 17 may supply current between the second source line 35 and a corresponding bit line 33, thereby supplying the current to the read element 40 and the second magnetic body 32.

In the present embodiment, the first switch 41 is an inter-terminal switch element which is connected in series between the first magnetic body 31 and the first source line 34. In addition, in the present embodiment, the second switch 42 is an inter-terminal switch element which is connected in series between the second magnetic body 32 and the second source line 35.

The inter-terminal switch element switches two terminals to an OFF state (i.e., high resistance state (HRS) or disconnected state) or an ON state (i.e., low resistance state (LRS) or connected state). The inter-terminal switch element performs switching to the OFF state or the ON state in response to a voltage applied between the two terminals and current flowing between the two terminals. When the inter-terminal switch element is in the OFF state, no current flows to the first magnetic body 31 or the second magnetic body 32 which is connected thereto in series. When the inter-terminal switch element is in the ON state, current flows to the first magnetic body 31 or the second magnetic body 32 which is connected thereto in series.

Such an inter-terminal switch element changes to the ON state when a voltage equal to or greater than a threshold voltage value $V_{th}$ is applied in the OFF state. Moreover, in the ON state, the inter-terminal switch element maintains the ON state when current equal to or greater than a holding current value $I_{hold}$ continues to flow.

The inter-terminal switch element may have this function in either polarity of voltage. The inter-terminal switch element may contain at least one chalcogen element selected from the group consisting of Te, Se, and S. Alternatively, the inter-terminal switch element may contain chalcogenide that is a compound containing such a chalcogen element. In addition to this, the inter-terminal switch element may further contain at least one or more elements selected from the group consisting of B, Al, Ga, In, C, Si, Ge, Sn, As, P, and Sb.

In addition, each of the first switch 41 and the second switch 42 may be a field effect transistor instead of the inter-terminal switch element.

The connection area 46 in each of the plurality of memory units 20 is magnetically connected to a corresponding one field line 36 among the plurality of field lines 36.

Each of the plurality of field lines 36 passes between the first magnetic body 31 and the second magnetic body 32 in the memory unit 20 of a corresponding column. Moreover, each of the plurality of field lines 36 passes through the vicinity of the connection area 46 of the magnetic body pair 30 in the memory unit 20 of the corresponding column which is opposite to the read element 40 in the z direction. That is, each of the plurality of field lines 36 and the corresponding read element 40 are formed at positions facing each other in the z direction with the connection area 46 interposed therebetween. That is, the connection area 46 is formed between the field line 36 and the read element 40. Thus, each of the plurality of field lines 36 may apply an induction magnetic field to the connection area 46 of the magnetic body pair 30 in the corresponding memory unit 20 when current flows thereto.

That is, each of the plurality of field lines 36 functions as a write element that writes a magnetic domain in a magnetization direction by a magnetic field generated by current flowing through the connection area 46 in the magnetic body pair 30 of each of the one or more memory units 20 arranged in a corresponding column. Thus, the write control circuit 15 may supply current corresponding to information to be written, to the corresponding field line 36 to generate an induction magnetic field, thereby magnetically writing the information to the first magnetic body 31 or the second magnetic body 32 in the target memory unit 20.

Figure 3:
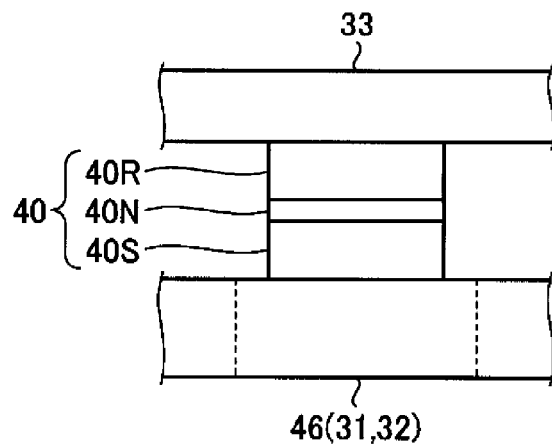
FIG. 3 is a schematic diagram illustrating structure of a read element.

FIG. 3 is a schematic diagram illustrating structure of the read element 40 implemented by an MTJ element.

The read element 40 implemented by the MTJ element includes a first magnetic layer 40S, a nonmagnetic layer 40N, and a second magnetic layer 40R. The first magnetic layer 40S is in contact with the connection area 46 of the first magnetic body 31 and the second magnetic body 32. In addition, the read element 40 may not include the first magnetic layer 40S. The second magnetic layer 40R is in contact with the bit line 33. The nonmagnetic layer 40N is disposed between the first magnetic layer 40S and the second magnetic layer 40R.

The first magnetic layer 40S is magnetized along a direction parallel to the boundary between the first magnetic layer 40S, the nonmagnetic layer 40N, and the second magnetic layer 40R (i.e., the in-plane direction of the x-y plane). At the time of reading, the magnetization direction of the first magnetic layer 40S is reversed according to the magnetization direction of the magnetic domain held by the connection area 46 of the first magnetic body 31 and the second magnetic body 32. The nonmagnetic layer 40N functions as a tunnel barrier.

The second magnetic layer 40R has magnetization in a fixed or unchanged direction and, for example, has coercivity greater than the coercivity of the first magnetic layer 40S. The magnetization direction of the second magnetic layer 40R is not reversed according to the magnetization direction of the first magnetic layer 40S and the magnetization direction of the magnetic domain held by the connection area 46. Here, the terms "the fixed or unchanged direction" means that the magnetization direction does not change for predetermined shift write current.

A set of the second magnetic layer 40R, the nonmagnetic layer 40N, and the first magnetic layer 40S exhibits a magnetoresistance effect. More specifically, when the magnetization direction of the first magnetic layer 40S and the magnetization direction of the second magnetic layer 40R are parallel and antiparallel, a set of the second magnetic layer 40R, the nonmagnetic layer 40N, and the first magnetic layer 40S indicates the minimum and maximum resistance values, respectively. The read element 40 is in a low resistance state when the magnetization directions of the first magnetic layer 40S and the second magnetic layer 40R are parallel (i.e., the same direction) and is in a high resistance state when the magnetization directions are antiparallel (i.e., the opposite directions).

The magnetization direction of the first magnetic layer 40S changes according to the magnetization direction of the magnetic domain held by the connection area 46 of the first magnetic body 31 and the second magnetic body 32. Thus, the resistance value of the read element 40 changes according to the magnetization direction held by the magnetic domain in the connection area 46 of the first magnetic body 31 and the second magnetic body 32. Thus, the read element 40 may function as an element that reads the magnetization direction of the magnetic domain held by the connection area 46 of the first magnetic body 31 and the second magnetic body 32. In addition, the read element 40 may include another additional layer.

Figure 4:
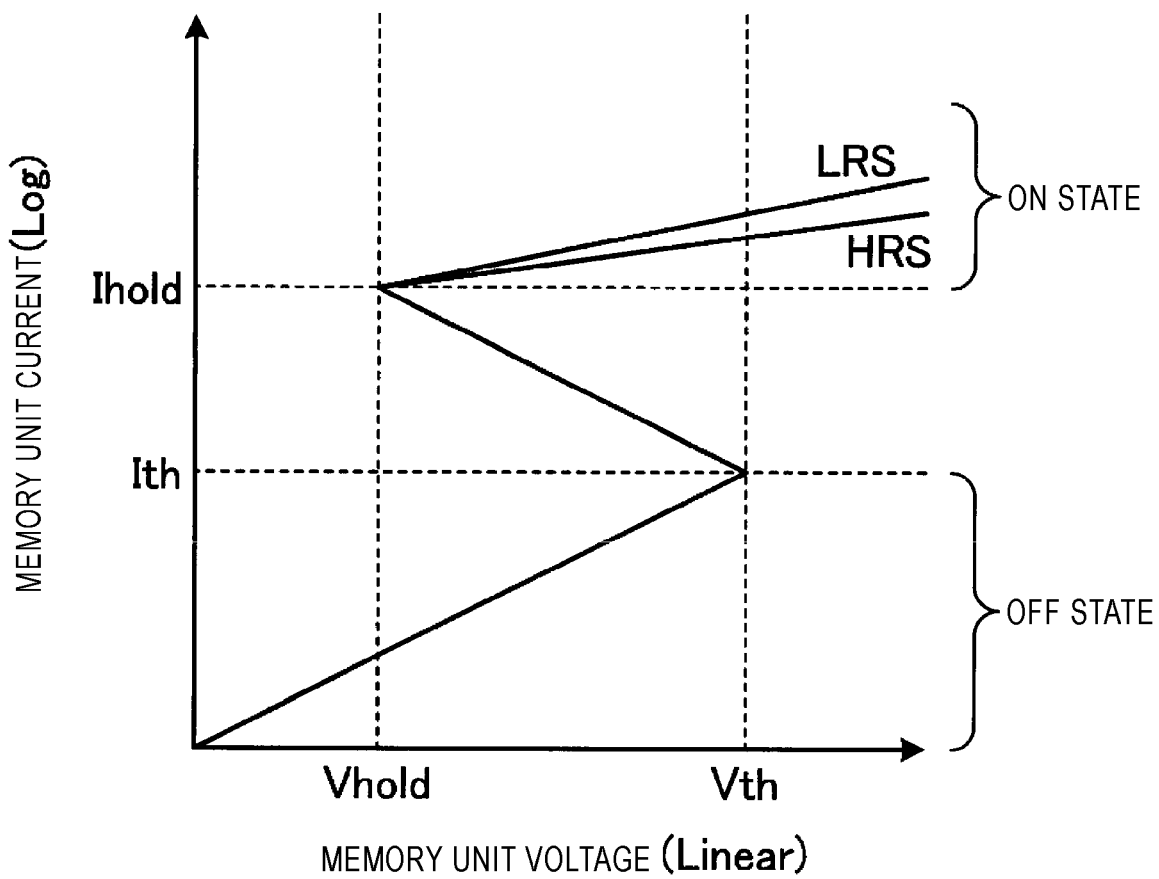
FIG. 4 is a diagram illustrating characteristics of a voltage applied to a memory unit and current flowing through the memory unit.

FIG. 4 is a diagram illustrating characteristics of a voltage applied to the memory unit 20 and current flowing through the memory unit 20 when the first switch 41 and the second switch 42 are inter-terminal switch elements.

In FIG. 4, the memory unit voltage on the horizontal axis is a voltage between the bit line 33 and the first source line 34 or between the bit line 33 and the second source line 35. The memory unit current on the vertical axis is the current flowing through the first switch 41 or the second switch 42.

In an initial state where the memory unit voltage is 0 and the memory unit current is 0, the inter-terminal switch element is in the OFF state. It is assumed that the memory unit voltage gradually rises while the inter-terminal switch element is in the OFF state. In this case, the inter-terminal switch element maintains the OFF state until the memory unit voltage reaches a predetermined threshold voltage value $V_{th}$. However, when the memory unit voltage becomes equal to or greater than the threshold voltage value $V_{th}$ and the memory unit current becomes equal to or greater than a threshold current value $I_{th}$, the inter-terminal switch element changes from the OFF state to the ON state.

When the inter-terminal switch element changes from the OFF state to the ON state, the resistance value of the inter-terminal switch element rapidly decreases. Thus, when the inter-terminal switch element changes from the OFF state to the ON state, the memory unit voltage drops sharply to a holding voltage value $V_{hold}$. On the other hand, the memory unit current rises sharply to a holding current value $I_{hold}$.

The inter-terminal switch element maintains the ON state when current equal to or greater than the holding current value $I_{hold}$ continues to flow in the ON state. However, when the current flowing through the inter-terminal switch element becomes smaller than the holding current value $I_{hold}$ in the ON state, the inter-terminal switch element no longer maintains the ON state and changes to the OFF state.

In addition, in the present embodiment, the read element 40 has a different resistance value according to a recorded magnetization direction. For example, the read element 40 is in an LRS when magnetized in a first recording direction, and is in an HRS when magnetized in a second recording direction opposite to the first recording direction. Thus, in the ON state, the memory unit 20 has different voltage-current characteristics according to whether the read element 40 is in the LRS or in the HRS.

Therefore, when the first switch 41 or the second switch 42 is in the ON state, the read control circuit 16 applies a constant voltage to the memory unit 20 to measure the value of the flowing current, thereby detecting the magnetization direction stored in the read element 40. Alternatively, when the first switch 41 or the second switch 42 is in the ON state, the read control circuit 16 may apply constant current to the memory unit 20 to measure the value of the applied voltage, thereby detecting the magnetization direction stored in the read element 40.

Figure 5:
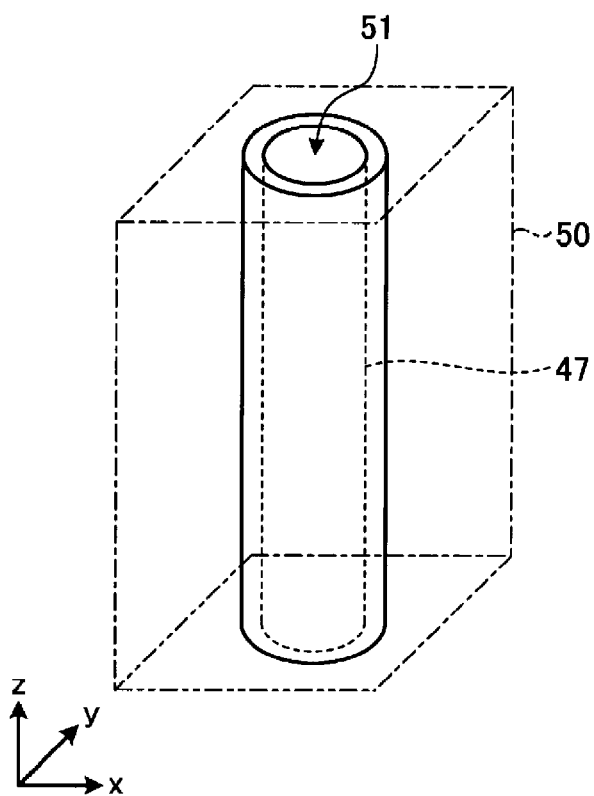
FIG. 5 is a diagram illustrating a storage area of a magnetic body.

FIG. 5 is a diagram illustrating the storage area 47 of the first magnetic body 31 and the second magnetic body 32.

The storage area 47 of the first magnetic body 31 and the second magnetic body 32 is formed by depositing a ferromagnetic material on the inner side surface of a hole 51 formed in the z direction in a predetermined layer of the substrate. Thus, the storage area 47 of the first magnetic body 31 and the second magnetic body 32 has a cylindrical shape with the central axis in the z direction. In addition, the storage area 47 may have a columnar shape, the inside of which is not hollow, or may not have a cylindrical shape or a columnar shape. In addition, the storage area 47 may take the shape of a bottomed cylinder having a bottom at the end thereof opposite to the connection area 46. In addition, the inside of the cylinder in the storage area 47 may be filled with a nonmagnetic insulator.

Figure 6:
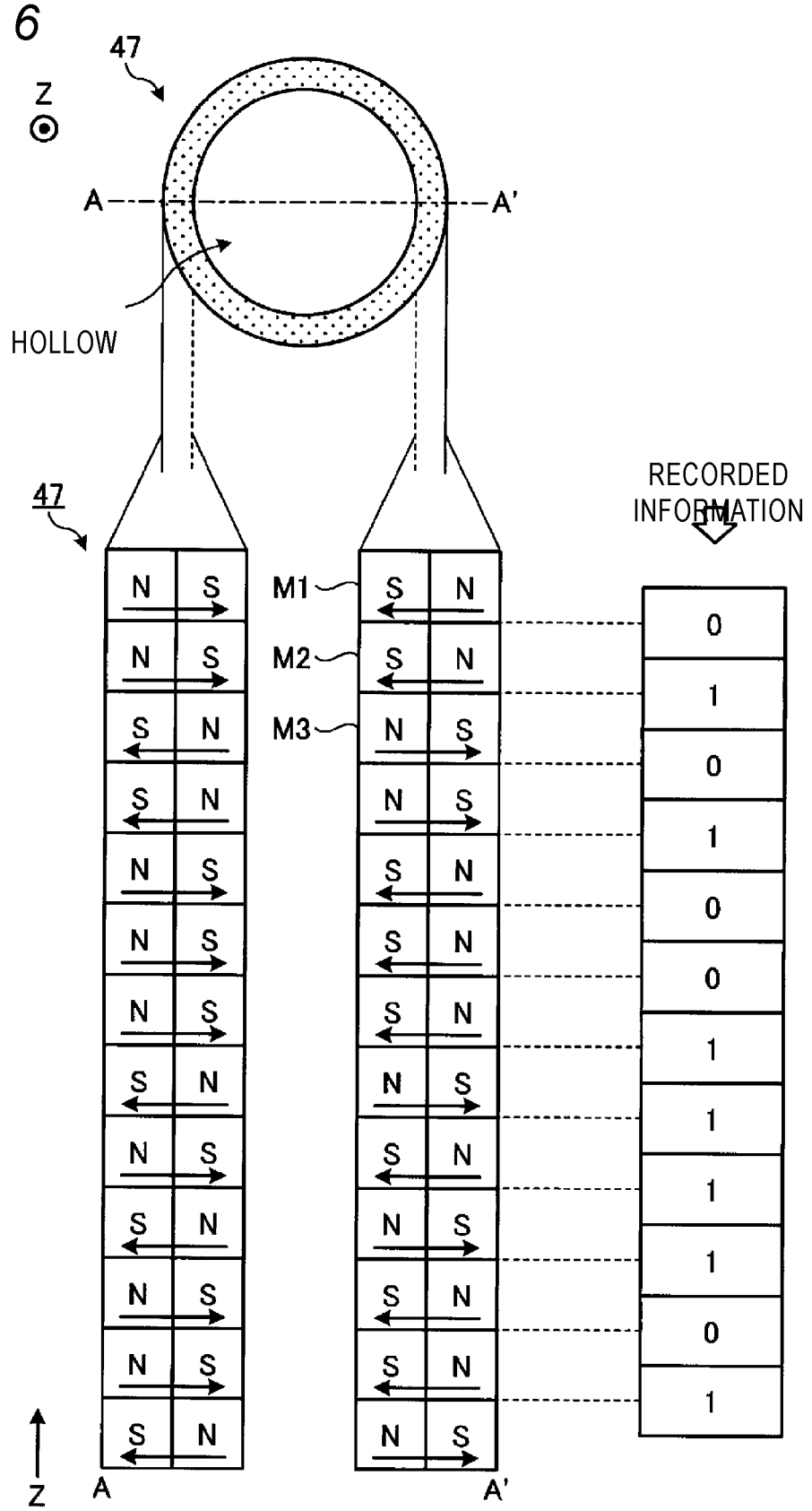
FIG. 6 is a diagram illustrating magnetic domains held by the magnetic body and recorded information.

FIG. 6 is a diagram illustrating magnetic domains held by the storage areas 47 of the first magnetic body 31 and the second magnetic body 32 and recorded information. More specifically, the upper portion of FIG. 6 shows a schematic diagram of the storage area 47 as viewed in the z direction. The lower portion of FIG. 6 illustrates magnetization directions of a plurality of magnetic domains held by a region viewed by cutting the storage area 47 along the line A-A', and recorded information indicated by the magnetization directions of the plurality of magnetic domains.

The storage area 47 may hold a plurality of magnetic domains along the longitudinal direction (i.e., the z direction). In FIG. 6, the upper side in the drawing is in contact with the connection area 46. In the example of FIG. 6, the storage area 47 holds magnetic domains M1, M2, M3, . . . from the connection area 46 side.

Each magnetic domain is magnetized in the first recording direction or in the second recording direction opposite to the first recording direction. As illustrated in FIG. 6, each magnetic domain has a magnetization direction formed in the order of an N pole and an S pole from the outer peripheral side or a magnetization direction formed in the order of an S pole and an N pole from the outer peripheral side. In addition, the magnetization direction of each magnetic domain may be orthogonal to the longitudinal direction of the storage area 47 (i.e., the z direction), or may be the longitudinal direction of the storage area 47 (i.e., the z direction).

For example, when the magnetization directions of two magnetic domains which are adjacent to each other in the longitudinal direction of the storage area 47 (i.e., the z direction) are the same, the storage area 47 stores first data in the two magnetic domains. When the magnetization directions of the two adjacent magnetic domains are different, the storage area 47 stores second data different from the first data in the two magnetic domains. For example, when the magnetization directions of two adjacent magnetic domains are the same, the storage area 47 stores "0" in the two magnetic domains. For example, when the magnetization directions of two adjacent magnetic domains are different, the storage area 47 stores "1" in the two magnetic domains.

In addition, when the magnetization directions of two adjacent magnetic domains are different as in M2 and M3, a domain wall is generated between the magnetic domains. However, when the magnetization directions of adjacent magnetic domains are the same as in M1 and M2, no domain wall is generated between the magnetic domains.

Figure 7:
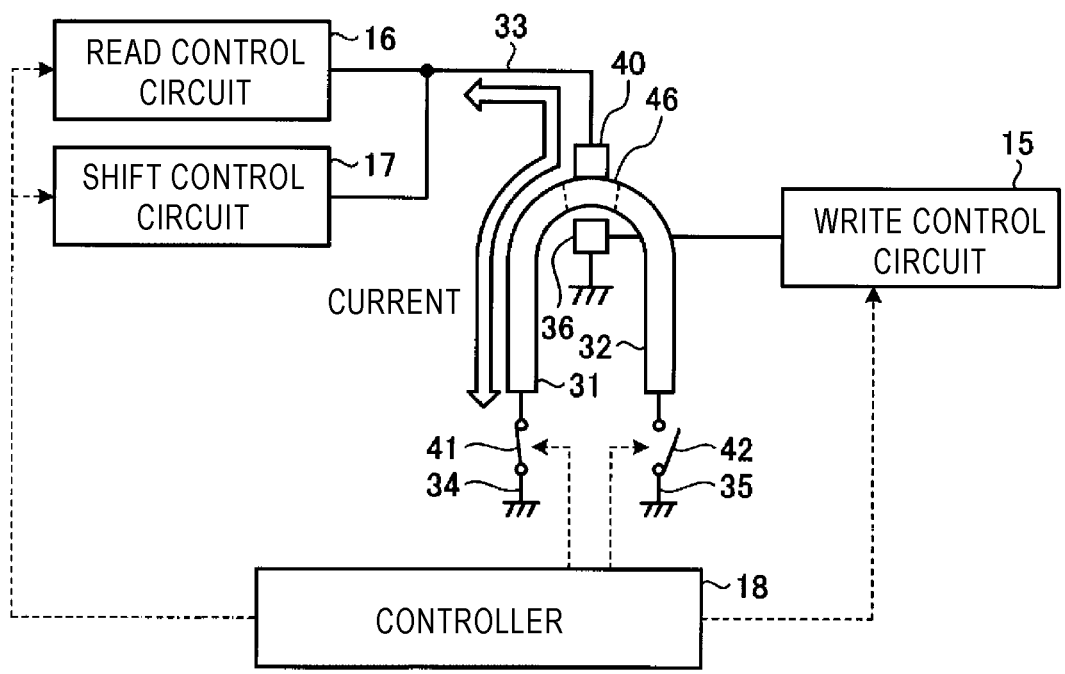
FIG. 7 is a diagram illustrating a switch state when read current or shift current is supplied to a first magnetic body.
Figure 8:
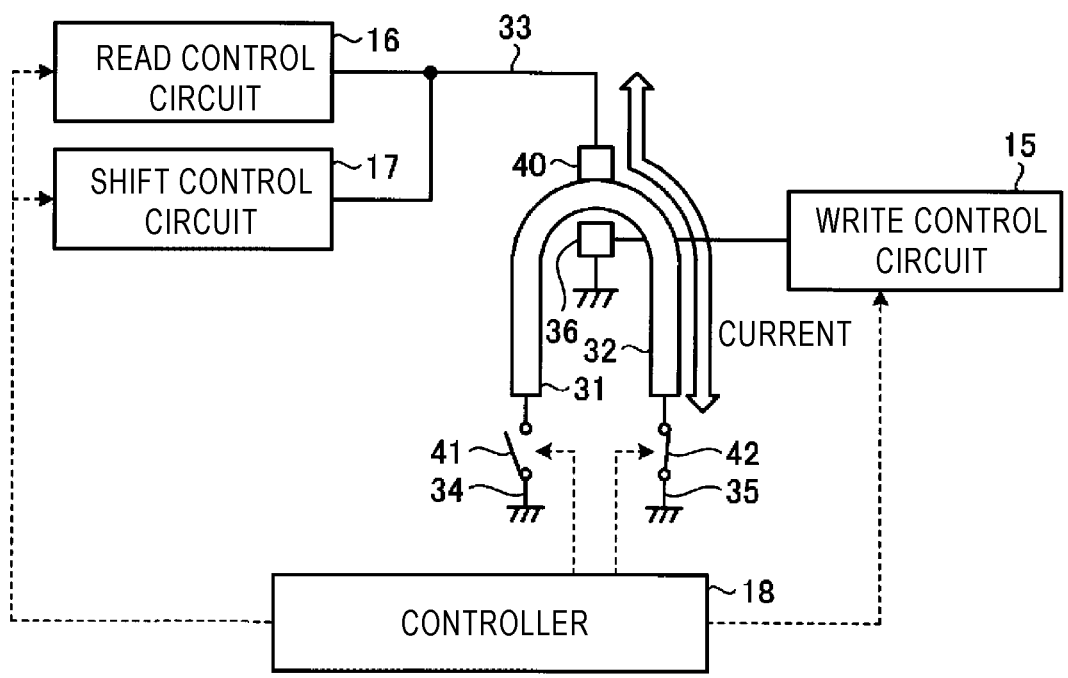
FIG. 8 is a diagram illustrating a switch state when read current or shift current is supplied to a second magnetic body.

FIG. 7 is a diagram illustrating a switch state when read current or a shift current is supplied to the first magnetic body 31. FIG. 8 is a diagram illustrating a switch state when read current or shift current is supplied to the second magnetic body 32.

The write control circuit 15 supplies current in a direction depending on information to be recorded, to the field line 36 which is a write element to write a new magnetic domain to the connection area 46 in the first magnetic body 31 or the second magnetic body 32. The read control circuit 16 supplies read current to the read element 40 to acquire information on the magnetization direction of the magnetic domain held by the connection area 46 in the first magnetic body 31 or the second magnetic body 32.

Moreover, the shift control circuit 17 supplies shift pulse current to the first magnetic body 31 or the second magnetic body 32 prior to writing a new magnetic domain by the write control circuit 15 or prior to acquiring information on the magnetization of the magnetic domains by the read control circuit 16 to shift the magnetic domains held by the first magnetic body 31 or the second magnetic body 32 in a predetermined direction.

Here, as illustrated in FIG. 7, when accessing the magnetic domains stored in the first magnetic body 31, the controller 18 sets the first switch 41 to the connected state and sets the second switch 42 to the disconnected state. That is, when accessing the magnetic domains stored in the first magnetic body 31, the controller 18 sets the first magnetic body 31 to a state where the supply of current thereto is possible and sets the second magnetic body 32 to a state where no current is supplied thereto. On the contrary, as illustrated in FIG. 8, when accessing the magnetic domains stored in the second magnetic body 32, the controller 18 sets the second switch 42 to the connected state and sets the first switch 41 to the disconnected state. That is, when accessing the second magnetic body 32, the controller 18 sets the first magnetic body 31 to a state where no current is supplied thereto and sets the second magnetic body 32 to a state where the supply of current thereto is possible.

For example, in a case of shifting the magnetic domains held by the first magnetic body 31, as illustrated in FIG. 7, the controller 18 sets the first switch 41 to the connected state and sets the second switch 42 to the disconnected state. On the contrary, for example, when shifting the magnetic domains held by the second magnetic body 32, as illustrated in FIG. 8, the controller 18 sets the second switch 42 to the connected state and sets the first switch 41 to the disconnected state.

Figure 9:
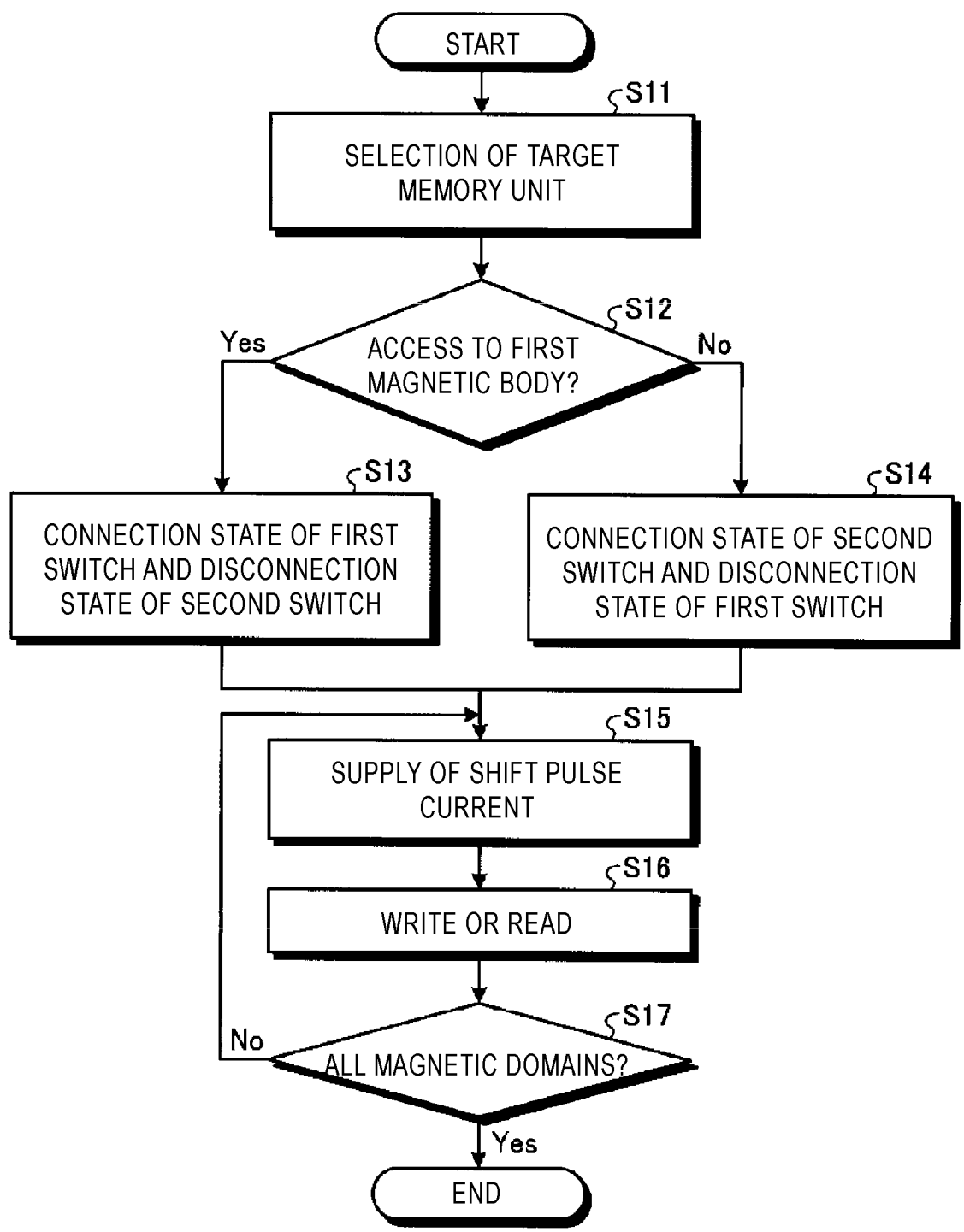
FIG. 9 is a flow chart illustrating a process performed by the magnetic storage device at the time of writing or reading.

FIG. 9 is a flow chart illustrating a process performed by the magnetic storage device 10 at the time of writing and at the time of reading. The controller 18 operates write and read operations according to the flow illustrated in FIG. 9.

First, in S11, the controller 18 selects a memory unit as an access target. Subsequently, in S12, the controller 18 determines whether to access the first magnetic body 31 in the target memory unit 20 or to access the second magnetic body 32 in the target memory unit 20.

When accessing the first magnetic body 31 (Yes in S12), the controller 18 advances the processing to S13. In S13, the controller 18 sets the first switch 41 to the connected state and sets the second switch 42 to the disconnected state. On the other hand, when accessing the second magnetic body 32 (No in S12), the controller 18 advances the processing to S14. In S14, the controller 18 sets the second switch 42 to the connected state and sets the first switch 41 to the disconnected state. The controller 18 advances the processing to S15 after S13 or S14.

In S15, the controller 18 causes the shift control circuit 17 to supply shift pulse current. When reading the magnetization direction of the magnetic domains held by the first magnetic body 31 or the second magnetic body 32, the shift control circuit 17 supplies shift pulse current to shift the magnetic domains held by the first magnetic body or the second magnetic body 32 in the direction of approaching the connection area 46. In addition, when writing a new magnetic domain to the first magnetic body 31 or the second magnetic body 32, the shift control circuit supplies shift pulse current to shift the magnetic domains held by the first magnetic body 31 or the second magnetic body 32 in the direction away from the connection area 46.

Subsequently, in S16, at the time of writing, the controller 18 causes the write control circuit 15 to supply current in a direction depending on information to be recorded, to the field line 36 which is a write element. In S16, at the time of reading, the controller 18 causes the read control circuit 16 to acquire information on the magnetization direction read by the read element 40.

Subsequently, in S17, the controller 18 determines whether all magnetic domains have been written to the first magnetic body 31 or the second magnetic body 32 or all magnetic domains have been read out from the first magnetic body 31 or the second magnetic body 32. When all of the magnetic domains have not been written or when all of the magnetic domains have not been read (No in S17), the controller 18 returns the processing to S15 and repeats the processing from S15. When all of the magnetic domains have been written or when all of the magnetic domains have been read out (Yes in S17), the controller 18 ends this flow.

Figure 10:
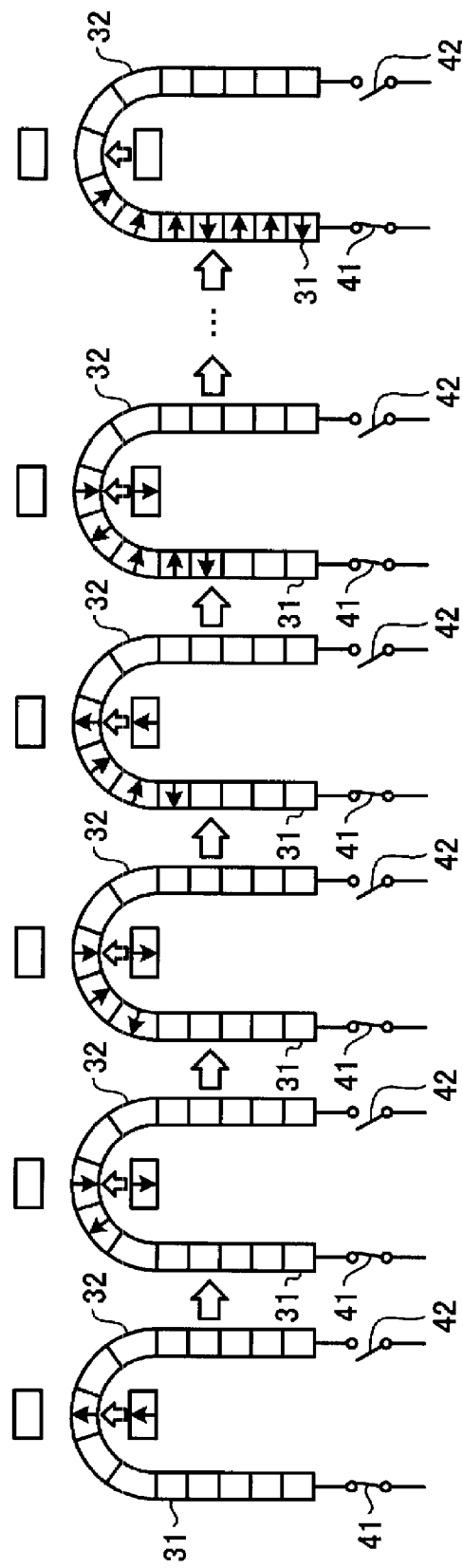
FIG. 10 is a diagram illustrating magnetic domains held by the first magnetic body at the time of writing to the first magnetic body.

FIG. 10 is a diagram illustrating the magnetic domains held by the first magnetic body 31 at the time of writing to the first magnetic body 31.

At the time of writing to the first magnetic body 31, the first switch 41 is in the connected state and the second switch 42 is in the disconnected state. Thus, at the time of writing to the first magnetic body 31, the supply of shift pulse current in a writing direction is possible from the shift control circuit 17 to the first magnetic body 31.

In the connection area 46 of the first magnetic body 31, one magnetic domain in the magnetization direction depending on write current is written by one write operation. After the write operation is completed once, shift pulse current is supplied to the first magnetic body 31 to shift all of the held magnetic domains by one magnetic domain in the direction away from the connection area 46. Thus, in the first magnetic body 31, a space is created in the connection area 46, which makes it possible to write a next new effective magnetic domain.

Thereafter, in the first magnetic body 31, the write operation and the supply of shift pulse current are alternately performed. Then, when the firstly written magnetic domain reaches the end position of the first magnetic body 31 opposite to the write element (i.e., the field line 36), the first magnetic body 31 no longer executes writing of a new magnetic domain.

As described above, a new magnetic domain is written to the first magnetic body 31 while previously written magnetic domains are sequentially shifted toward an end position.

Figure 11:
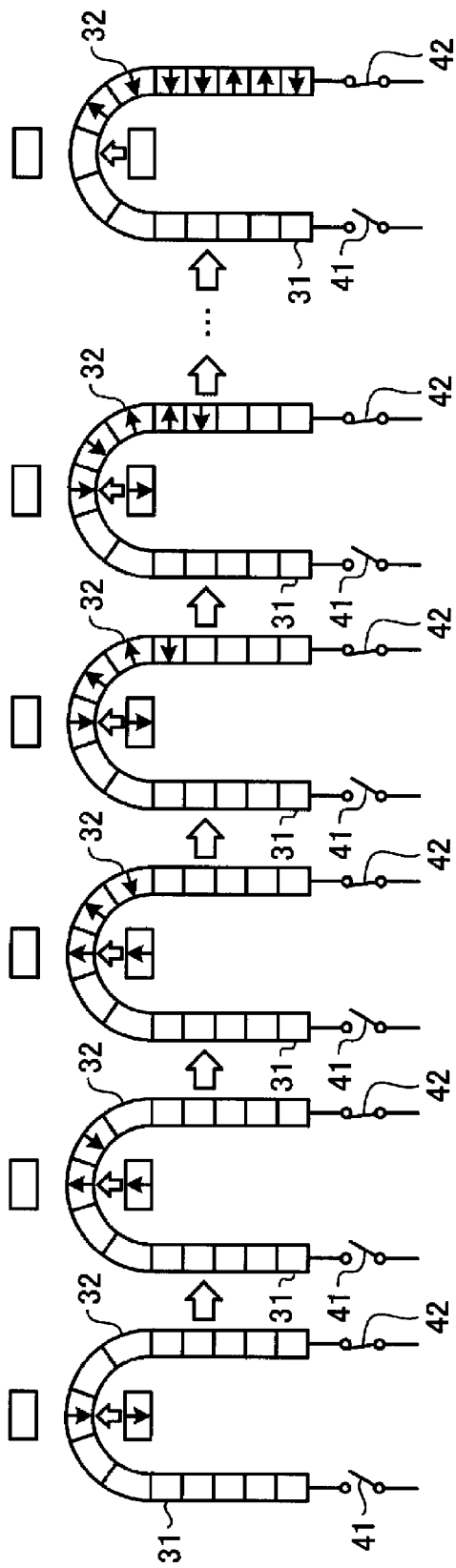
FIG. 11 is a diagram illustrating magnetic domains held by the second magnetic body at the time of writing to the second magnetic body.

FIG. 11 is a diagram illustrating the magnetic domains held by the second magnetic body 32 at the time of writing to the second magnetic body 32.

At the time of writing to the second magnetic body 32, the second switch 42 is in the connected state and the first switch 41 is in the disconnected state. Thus, at the time of writing to the second magnetic body 32, the supply of shift pulse current from the shift control circuit 17 to the second magnetic body 32 is possible and the supply of shift pulse current to the first magnetic body 31 is not possible.

Then, at the time of writing to the second magnetic body 32, a processing similar to the write operation for the first magnetic body 31 is performed on the second magnetic body 32 so that the second switch 42 is in the connected state and the first switch 41 is in the disconnected state. Thus, a new magnetic domain is written to a write position in the second magnetic body 32 while previously written magnetic domains are sequentially shifted toward an end position.

Figure 12:
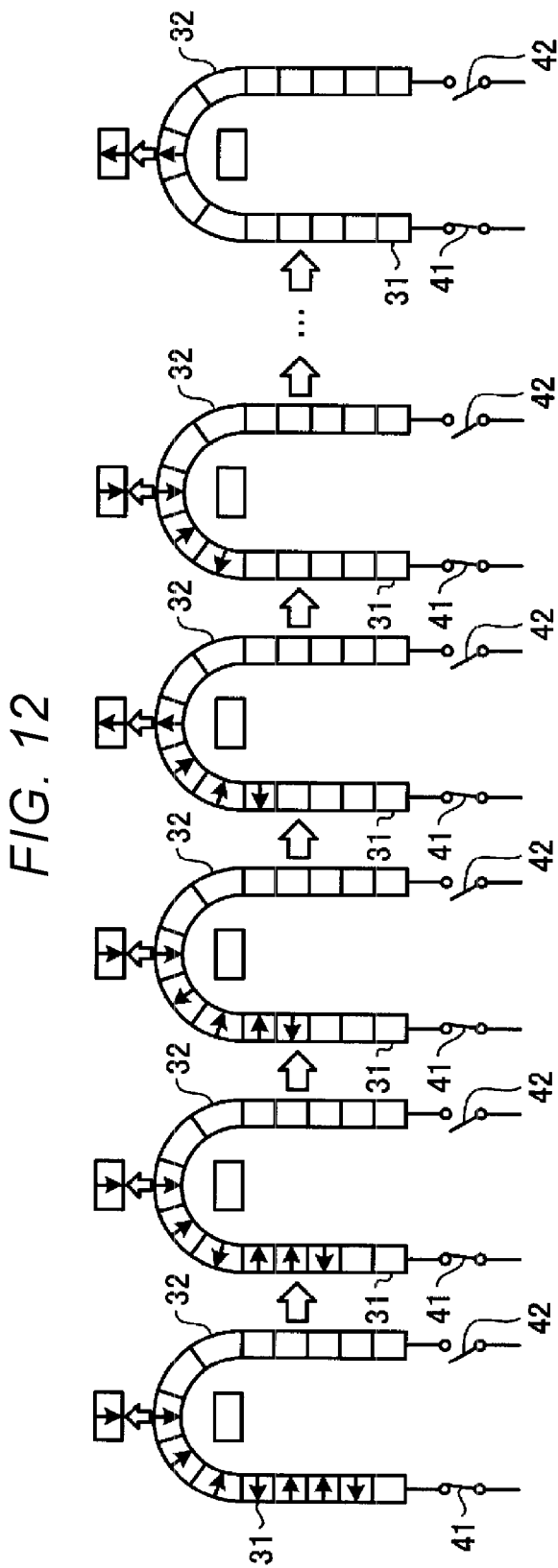
FIG. 12 is a diagram illustrating magnetic domains held by the first magnetic body at the time of reading for the first magnetic body.

FIG. 12 is a diagram illustrating the magnetic domains held by the first magnetic body 31 at the time of reading for the first magnetic body 31.

At the time of reading for the first magnetic body 31, the first switch 41 is in the connected state and the second switch 42 is in the disconnected state. Thus, at the time of reading for the first magnetic body 31, the supply of shift pulse current from the shift control circuit 17 to the first magnetic body 31 is possible and the supply of shift pulse current to the second magnetic body 32 is not possible.

The magnetization direction of one magnetic domain is read out from the connection area 46 of the first magnetic body 31 by one read operation. After the read operation is completed once, shift pulse current is supplied to the first magnetic body 31 to shift all held magnetic domains by one magnetic domain in the direction of approaching the connection area 46. Thus, the first magnetic body 31 may enable reading of a next magnetic domain of the most recently read magnetic domain.

Thereafter, in the first magnetic body 31, the read operation and the supply of shift pulse current are alternately performed. Then, when the last magnetic domain (i.e., the magnetic domain stored at the position farthest from the connection area 46) reaches the connection area 46, the first magnetic body 31 is in a state where all magnetic domains are read out.

As described above, the magnetic domains are sequentially read out from the first magnetic body 31 while the held magnetic domains are sequentially shifted in the direction of approaching the connection area 46.

Figure 13:
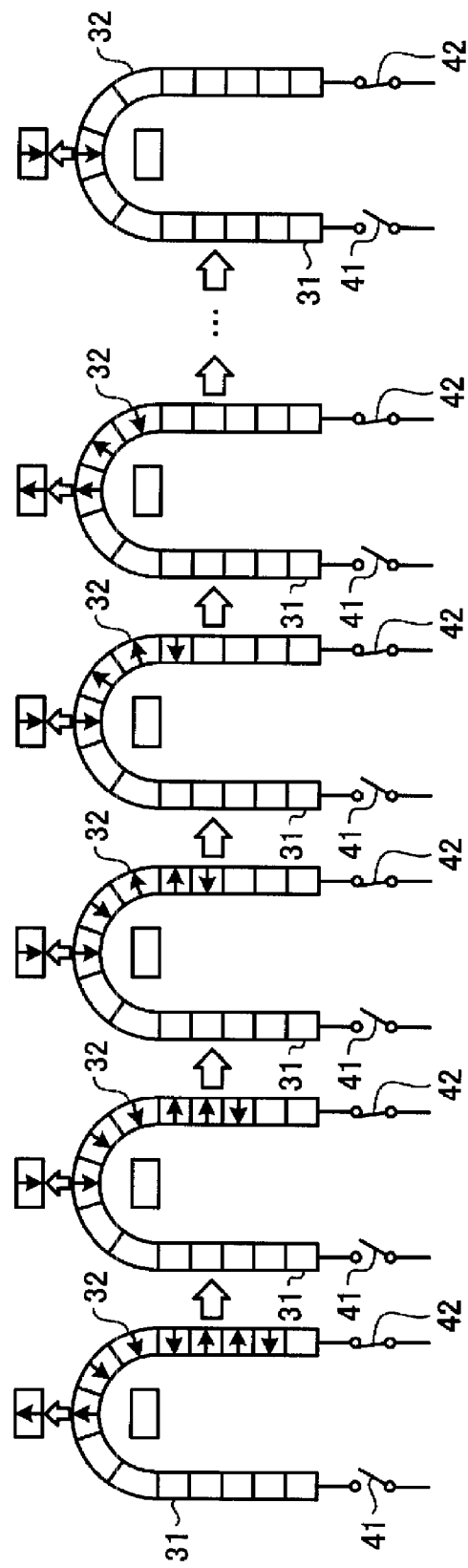
FIG. 13 is a diagram illustrating magnetic domains held by the second magnetic body at the time of reading for the second magnetic body.

FIG. 13 is a diagram illustrating the magnetic domains held by the second magnetic body 32 at the time of reading for the second magnetic body 32.

At the time of reading for the second magnetic body 32, the second switch 42 is in the connected state and the first switch 41 is in the disconnected state. Thus, at the time of reading to the second magnetic body 32, the supply of shift pulse current from the shift control circuit 17 to the second magnetic body 32 is possible and the supply of shift pulse current to the first magnetic body 31 is not possible.

Then, at the time of reading for the second magnetic body 32, the same processing as the read operation for the first magnetic body 31 is performed on the second magnetic body 32 so that the second switch 42 is in the connected state and the first switch 41 is in the disconnected state. Thus, the magnetic domains are sequentially read out from the second magnetic body 32 while the held magnetic domains are sequentially shifted in the direction of approaching the connection area 46.

(Example of Configuration of Partial Region 60 of Magnetic Storage Device 10)

Next, descriptions will be made on an example of a semiconductor configuration of a partial region 60 including one memory unit 20 in the magnetic storage device 10.

Figure 14:
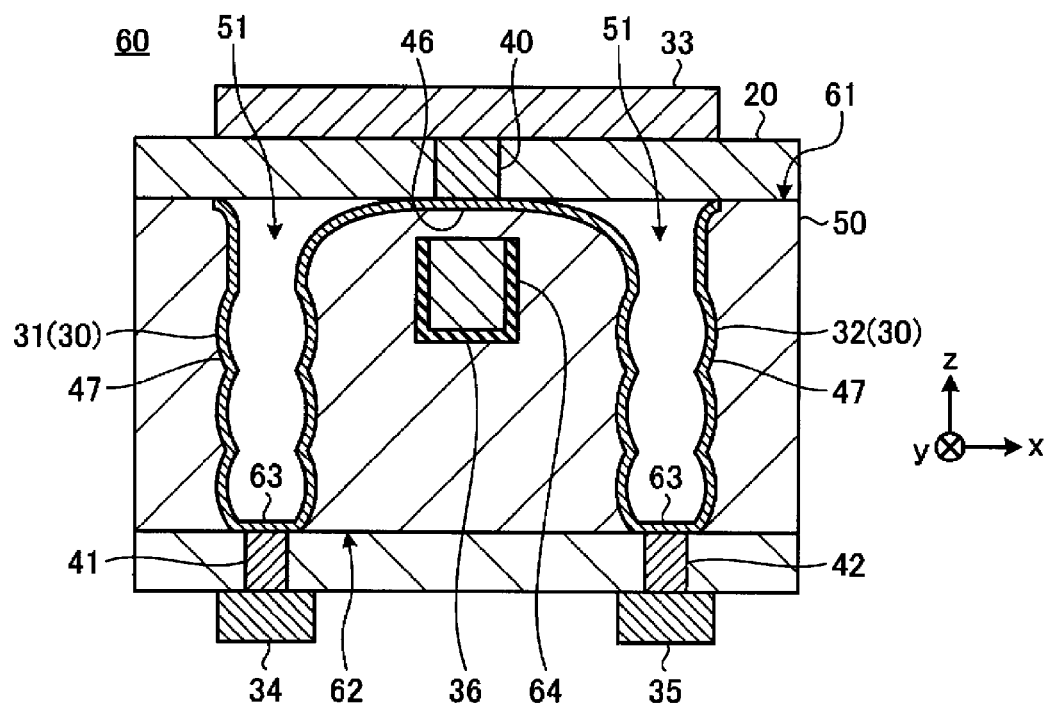
FIG. 14 is a cross-sectional view of a partial region including one memory unit in the storage device.
Figure 15:
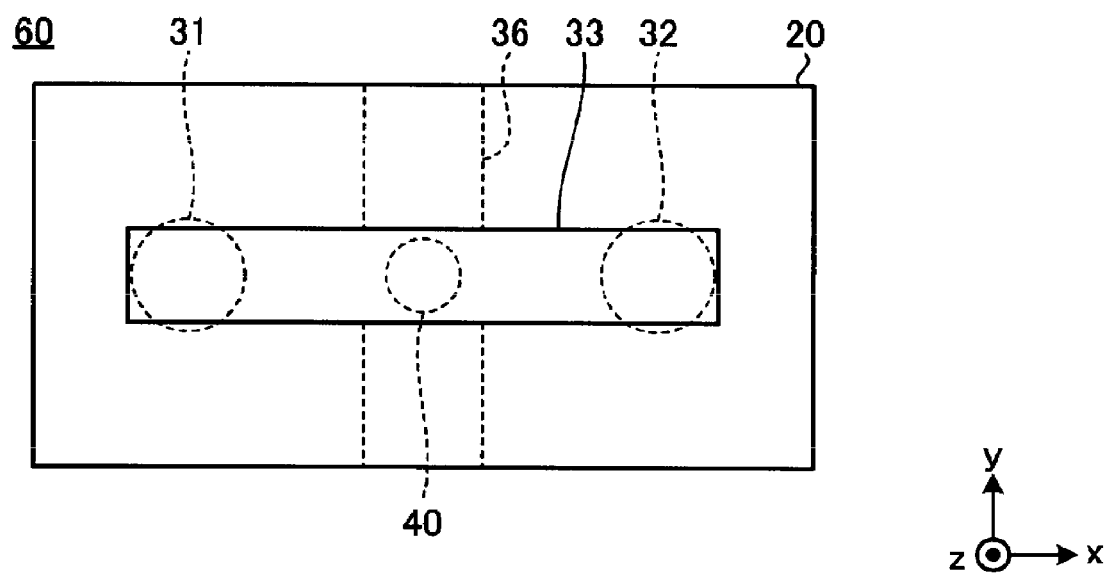
FIG. 15 is a plan view of the partial region as viewed from above.
Figure 16:
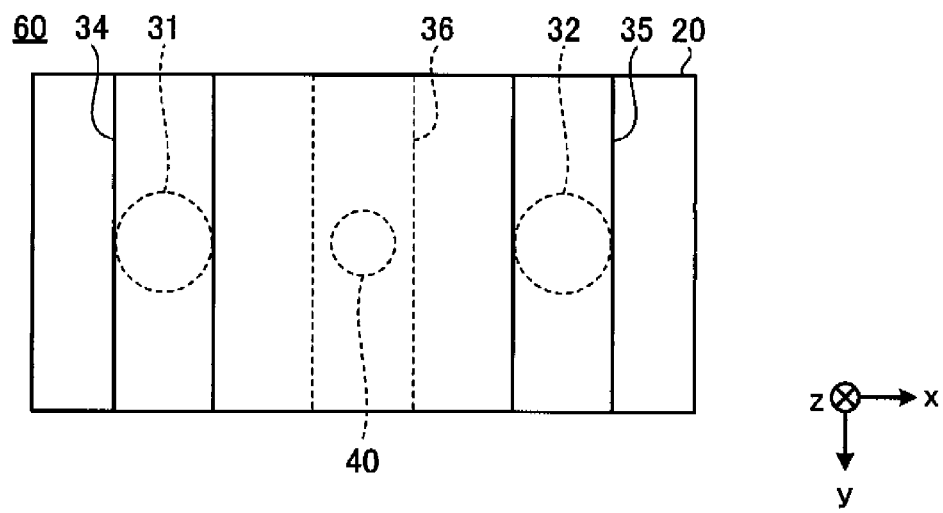
FIG. 16 is a plan view of the partial region as viewed from below.

FIG. 14 is a cross-sectional view of the partial region 60 including one memory unit 20 in the magnetic storage device 10. FIG. 15 is a plan view of the partial region 60 as viewed from above. FIG. 16 is a plan view of the partial region 60 as viewed from below.

Two hollow holes 51 extending in the z direction are formed in the partial region 60 including one memory unit 20 on an insulating layer 50. A conductive ferromagnetic material is deposited on the inner side surface of the two holes 51. Moreover, a conductive ferromagnetic material is also deposited around the two holes 51 on a first surface 61 of the insulating layer 50.

Thus, the end regions on the connection area 46 side in the first magnetic body 31 and the second magnetic body 32 are formed in a film shape on the first surface 61 of the insulating layer 50. The end regions on the connection area 46 side in the first magnetic body 31 and the second magnetic body 32 are formed in the region between the two holes 51 on the first surface 61.

In addition, the storage area 47 excluding the end regions on the connection area 46 side in the first magnetic body 31 and the second magnetic body 32 extends in the z direction in the insulating layer 50. The storage area 47 in the first magnetic body 31 and the second magnetic body 32 has a hollow cylinder shape. In addition, a nonmagnetic insulator may be formed in the cylinder.

In addition, the two holes 51 are filled with a ferromagnetic material on a second surface 62 side opposite to the first surface 61 of the insulating layer 50. Thus, the storage area 47 in the first magnetic body 31 and the second magnetic body 32 has a bottom portion 63 formed of the ferromagnetic material on the side opposite to the connection area 46.

The read element 40 is formed at the upper side of the connection area 46 in the first magnetic body 31 and the second magnetic body 32. The read element 40 is in direct contact with the connection area 46 and is electrically and magnetically connected to the connection area 46.

The bit line 33 is formed in an upper side layer of the read element 40 so as to extend in the x direction. That is, the bit line 33 is formed on the first surface 61 side of the insulating layer 50 and extends in the x direction. The bit line 33 is electrically connected to the surface of the read element 40 opposite to the surface in contact with connection area 46.

The first switch 41 is formed at the lower side of the bottom portion 63 of the storage area 47 in the first magnetic body 31. The first switch 41 is electrically connected to the bottom portion 63 of the storage area 47 in the first magnetic body 31.

The second switch 42 is formed at the lower side of the bottom portion 63 of the storage area 47 in the second magnetic body 32. The second switch 42 is electrically connected to the bottom portion 63 of the storage area 47 in the second magnetic body 32.

The first source line 34 is formed in a lower side layer of the first switch 41 so as to extend in the y direction. That is, the first source line 34 is formed on the second surface 62 side of the insulating layer 50 and extends in the y direction. The first source line 34 is electrically connected to the surface of the first switch opposite to the surface in contact with the bottom portion 63.

The second source line 35 is formed in a lower side layer of the second switch 42 so as to extend in the y direction. That is, the second source line 35 is formed on the second surface 62 side of the insulating layer 50 and extends in the y direction. The second source line 35 is electrically connected to the surface of the second switch opposite to the surface in contact with the bottom portion 63.

The field line 36 corresponding to the partial region 60 is formed at the lower side of the connection area 46 in the insulating layer 50 so as to extend in the y direction. That is, the field line 36 and the read element 40 are formed at positions facing each other in the z direction with the connection area 46 interposed therebetween. Thus, the connection area 46 is formed between the field line 36 and the read element 40. In addition, a yoke 64 is deposited on the side surface of the field line 36 except for the surface of a portion facing the connection area 46. Thus, the field line 36 can efficiently apply a magnetic field generated by the flow of current to the connection area 46. Such a field line 36 is magnetically connected to the connection area 46 and functions as a write element for the connection area 46.

The magnetic storage device 10 having the configuration described above includes one read element 40 and one write element (i.e., one field line 36) for two magnetic bodies. Thus, since the magnetic storage device 10 executes writing on the two magnetic bodies using the common read element 40 and the common write element, the overall configuration thereof may be reduced. Thus, according to the magnetic storage device 10, the recording density thereof may be increased.

(Example of Configuration of Magnetic Storage Device 10 in which Multiple Memory Units 20 are Formed)

Next, descriptions will be made on an example of a configuration of the magnetic storage device 10 in which a plurality of memory units 20 are formed.

Figure 17:
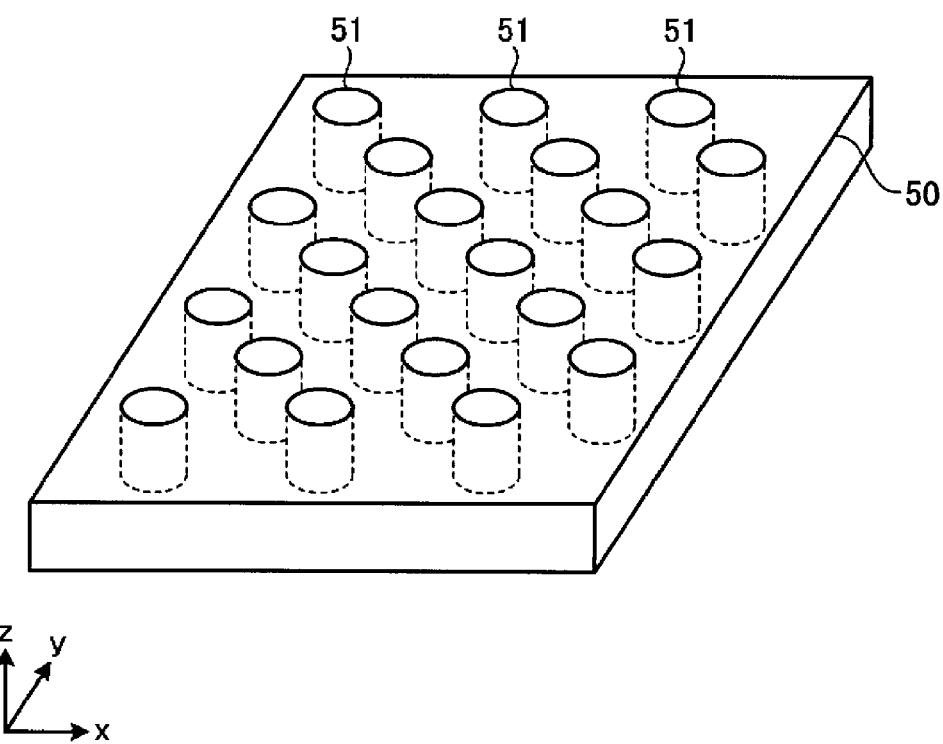
FIG. 17 is a perspective view of an insulating layer in a state where a plurality of holes are formed.

FIG. 17 is a perspective view of the insulating layer 50 in a state where a plurality of holes 51 are formed. In the present embodiment, the insulating layer 50 having the plurality of holes 51 penetrating a layer in the z direction is formed by a wet etching process using an anodic oxidation method.

Descriptions will be made on a method of manufacturing the insulating layer 50 using an anodic oxidation method. First, a base material such as aluminum is used as an anode, and current is supplied in an electrolyte solution (e.g., sulfuric acid, oxalic acid, or phosphoric acid).

Thus, an anode metal is oxidized to become metal ions and dissolves. The metal ions combine with oxygen in the solution to form a metal oxide, and remain and grow on the surface of the anode metal. That is, an oxide (i.e., alumina) grows on the anode metal. At this time, since dissolution and growth proceed simultaneously, the insulating layer 50 having the fine holes 51 of alumina is formed on the surface of the anode metal. Thereafter, the insulating layer 50 is separated from the anode metal. In addition, when anodic oxidation is performed, a barrier layer is formed on the bottom of the holes 51. For this reason, the insulating layer 50 is subjected to a membrane formation processing in which the barrier layer dissolves to allow the holes 51 to take the form of through-holes.

The size and pitch of the holes 51 are determined, for example, by the purity of aluminum, a voltage, an electrolyte solution, and a processing time. For example, in a case of performing an anodic oxidation processing on an aluminum substrate having a purity of 99.995% or more using sulfuric acid with several tens of volts for a several tens of minutes, the plurality of holes 51 having a diameter of 20 nm and a depth of 10 μm are formed at a pitch of 60 nm in the insulating layer 50.

In addition, the anodic oxidation method may be performed using a silicon substrate as a base material and hydrofluoric acid as an electrolyte solution. In this case, the insulating layer 50 is a silicon oxide having the plurality of holes 51.

Figure 18:
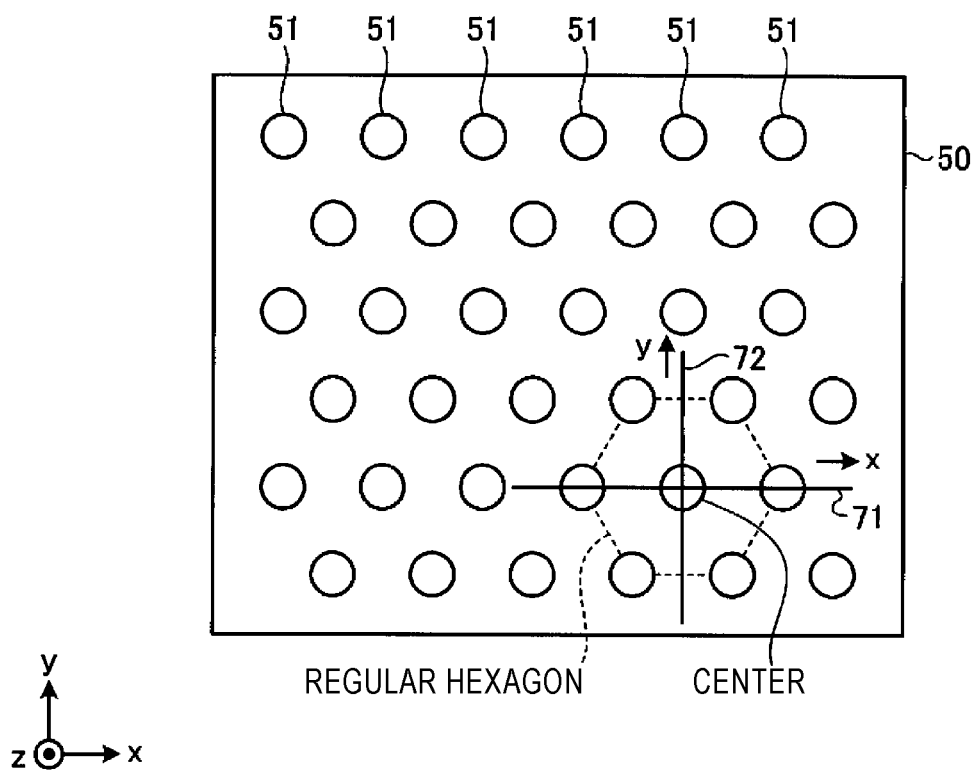
FIG. 18 is a plan view of the insulating layer in the state where the plurality of holes are formed as viewed from above.

FIG. 18 is a plan view of the insulating layer 50 in a state where the plurality of holes 51 are formed as viewed from above. When the insulating layer 50 is formed using the anodic oxidation method, the arrangement of the plurality of holes 51 has a hexagonal closely packed structure. For this reason, when focusing on one hole 51, the plurality of holes 51 around the focused hole 51 are arranged at the apexes of a regular hexagon centered on the focused hole 51.

In addition, in the present embodiment, the direction of a first straight line 71 which interconnects any two holes 51 facing each other with the center of the regular hexagon interposed therebetween is taken as the x direction. In addition, the direction of a second straight line 72 orthogonal to the first straight line 71 in the plane is taken as the y direction.

Figure 19:
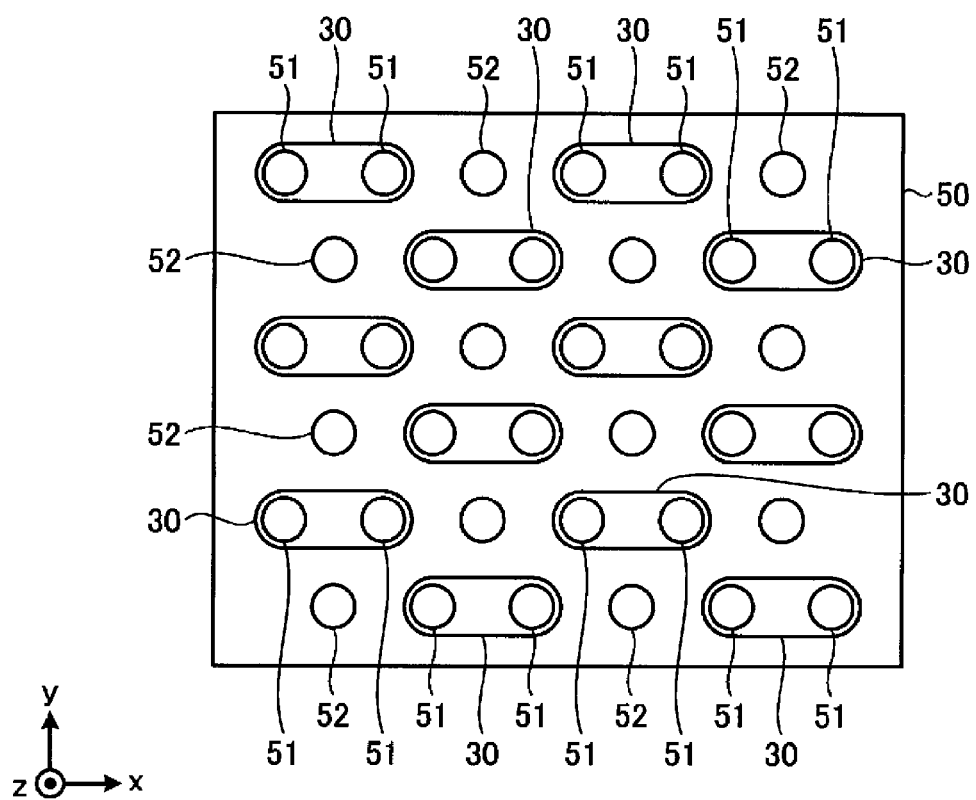
FIG. 19 is a plan view of the insulating layer in a state where a plurality of magnetic body pairs are formed as viewed from above.

FIG. 19 is a plan view of the insulating layer 50 in a state where the plurality of magnetic body pairs 30 are formed as viewed from above. After the insulating layer 50 is formed, the plurality of magnetic body pairs 30 is formed in the insulating layer 50.

Each of the plurality of magnetic body pairs 30 is formed using two holes 51 which are adjacent to each other in the x direction. More specifically, each of the plurality of magnetic body pairs 30 is formed by depositing a magnetic material on the inner side surface of the two holes 51 which are adjacent to each other in the x direction and the region between the two holes 51 on the upper surface of the insulating layer 50.

After forming the plurality of magnetic body pairs 30, the insulating layer 50 includes the plurality of magnetic body pairs 30 and a plurality of dummy holes 52 (i.e., the plurality of holes 51 not included in the magnetic body pairs 30) which are alternately arranged in the x direction. In addition, after forming the plurality of magnetic body pairs 30, the insulating layer 50 includes the plurality of magnetic body pairs 30 and a plurality of dummy holes 52 which are alternately arranged in the y direction.

In addition, the plurality of dummy holes 52 are filled, for example, with a certain material. Alternatively, the upper and lower surfaces of the plurality of dummy holes 52 may be closed. That is, no magnetic material is deposited in the plurality of dummy holes 52, and the dummy holes 52 are not used as the memory unit 20.

Figure 20:
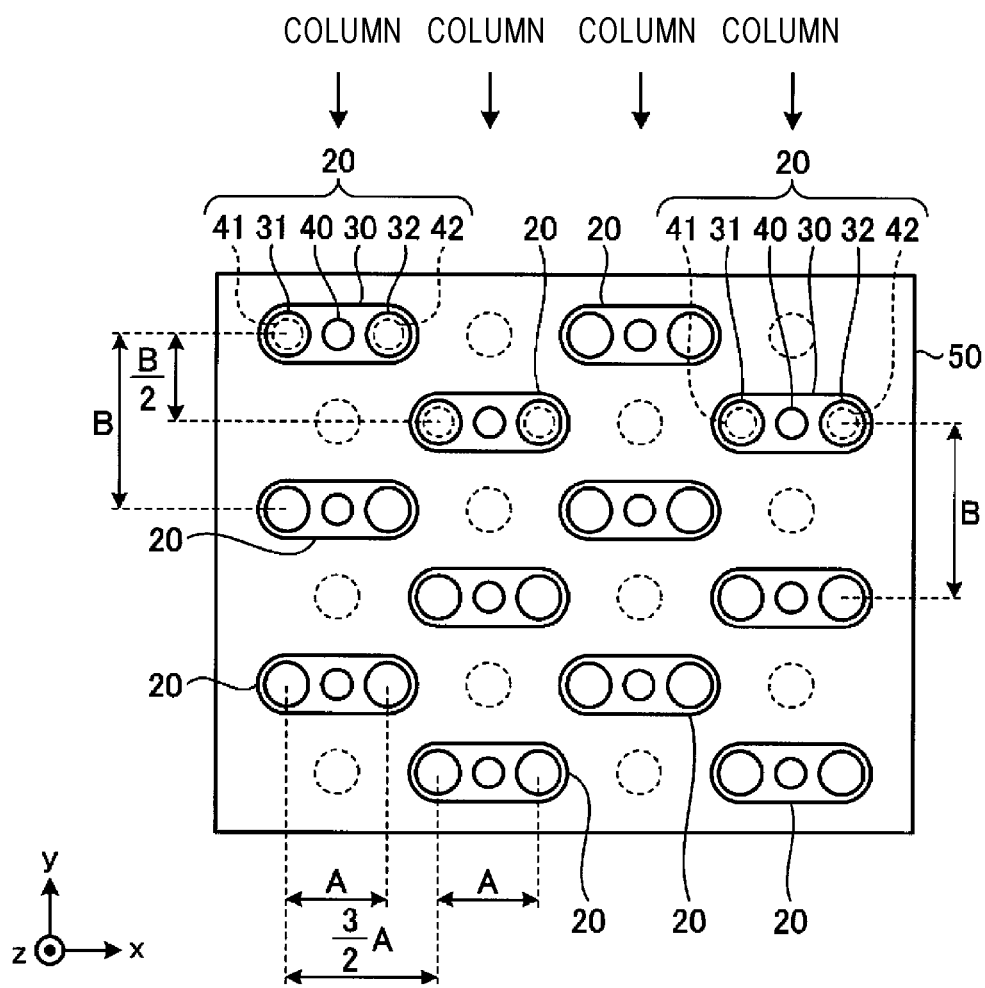
FIG. 20 is a plan view of the insulating layer in a state where a plurality of memory units are formed as viewed from above.

FIG. 20 is a plan view of the insulating layer 50 in a state where the plurality of memory units 20 are formed as viewed from above. In the present embodiment, each of the plurality of magnetic body pairs 30 includes, for example, the first magnetic body 31 on the left side in FIG. 20 and the second magnetic body 32 on the right side.

The read element 40 is formed on the magnetic material in the region between the first magnetic body 31 and the second magnetic body 32. In addition, the first switch 41 is formed below the first magnetic body 31. In addition, the second switch 42 is formed below the second magnetic body 32.

Then, each of the plurality of memory units 20 includes the magnetic body pair 30, the read element 40, the first switch 41, and the second switch 42.

Here, in the present embodiment, two or more memory units 20 arranged in the y direction constitute a column in a matrix. Then, the two or more memory units 20 in each of a plurality of columns are equally spaced apart from each other at an interval of a second distance B in the y direction. That is, the distance between two memory units 20 arranged in the column direction is the second distance B.

Moreover, the positions in the y direction of two or more memory units 20 in a first column are shifted from the positions in the y direction of two or more memory units 20 in a second column adjacent to the first column by half of the second distance. That is, the positions in the y direction of the plurality of memory units 20 are shifted by B/2 in the y direction for each column.

In addition, in the x direction, the distance between the storage area 47 of the first magnetic body 31 and the storage area 47 of the second magnetic body 32 is taken as a first distance A. In this case, the two or more memory units 20 in the first column and the two or more memory units 20 in the second column adjacent to the first column are spaced apart from each other in the x direction by 3/2 times of the first distance A. That is, the distance in the x direction of two or more memory units 20 in two adjacent columns is 3/2 times of the first distance A.

Figure 21:
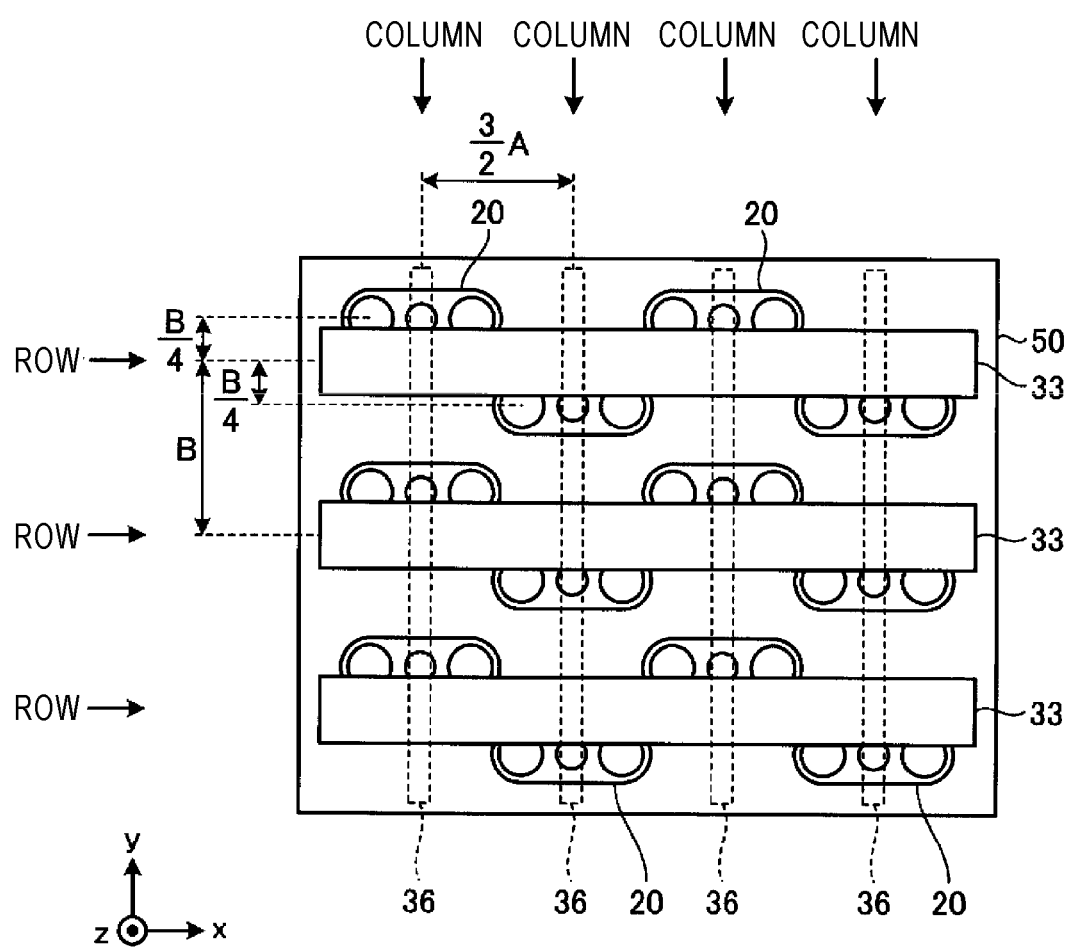
FIG. 21 is a plan view of the insulating layer formed with a plurality of bit lines as viewed from above.

FIG. 21 is a plan view of the insulating layer 50 in which the plurality of bit lines 33 are formed as viewed from above.

Each of the plurality of bit lines 33 is formed in a straight line extending in the x direction on the upper surface side of the insulating layer 50. The plurality of bit lines 33 are formed in parallel at an interval of the second distance B. Moreover, the position in the y direction of each of the plurality of bit lines 33 is shifted from the memory unit 20 in the y direction by ¼ of the second distance B. Then, each of the plurality of bit lines 33 is electrically connected to the read element 40 in the most recent one memory unit 20 among two or more memory units 20 in each of a plurality of columns.

Thus, each of the plurality of memory units 20 may be electrically connected to any one bit line 33. In addition, in the present embodiment, two or more memory units 20 connected to one bit line 33 constitute a row in a matrix.

In addition, each of the plurality of field lines 36 is formed in a straight line extending in the y direction in the insulating layer 50. The plurality of field lines 36 are formed in parallel at an interval of 3/2 of the first distance A. The position in the x direction of each of the plurality of field lines 36 is the same as the center of the memory unit 20 in a corresponding column. Then, each of the plurality of field lines 36 is magnetically connected to all memory units 20 in the corresponding column.

Figure 22:
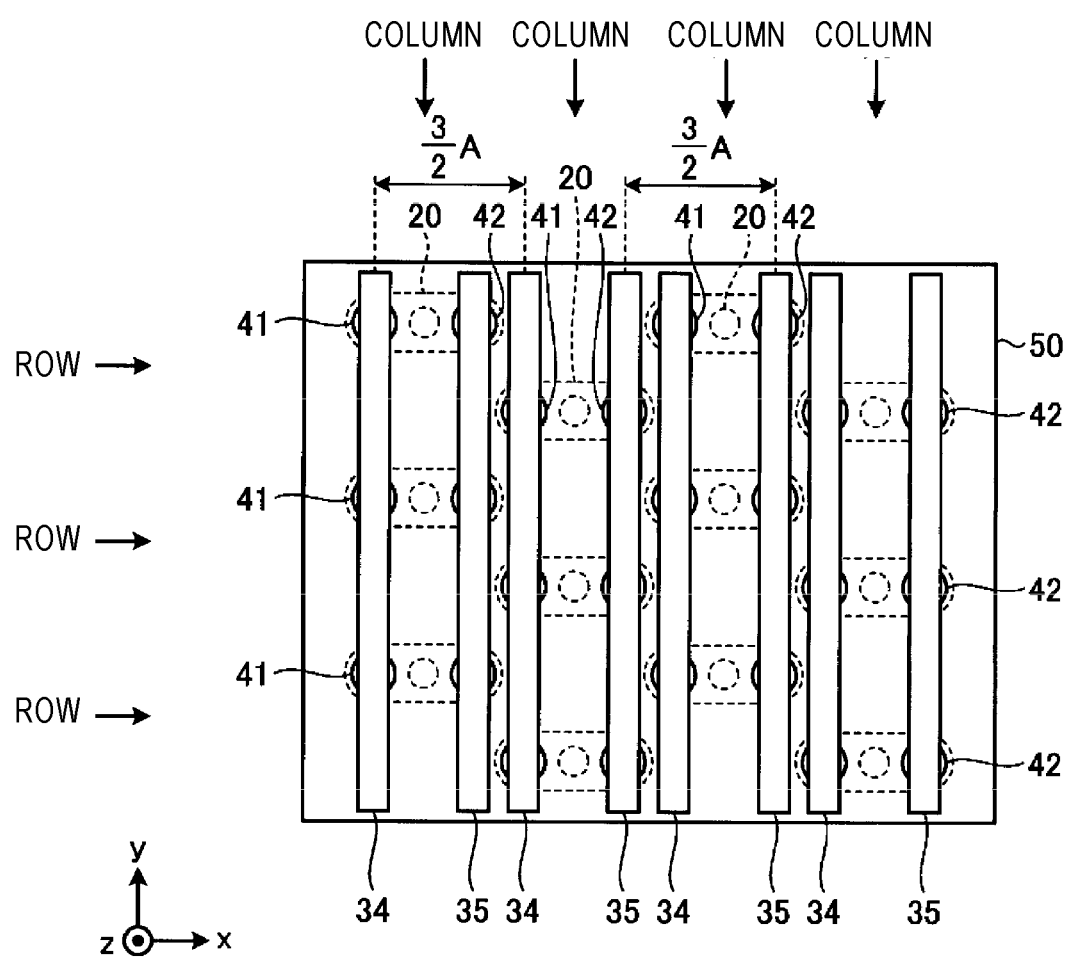
FIG. 22 is a plan view of the insulating layer formed with a plurality of first source lines and a plurality of second source lines as viewed from below.

FIG. 22 is a plan view of the insulating layer 50 in which the plurality of first source lines 34 and the plurality of second source lines 35 are formed as viewed from below.

Each of the plurality of first source lines 34 is formed in a straight line extending in the y direction on the lower surface side of the insulating layer 50. The plurality of first source lines 34 are formed in parallel at an interval of 3/2 of the first distance A.

Moreover, the position of each of the plurality of first source lines 34 in the x direction is the same as the first switch 41 of the memory unit 20 in a corresponding column. Then, each of the plurality of first source lines 34 is electrically connected to the first switches 41 of all of the memory units 20 in the corresponding column.

Each of the plurality of second source lines 35 is formed in a straight line extending in the y direction on the lower surface side of the insulating layer 50. The plurality of second source lines 35 are formed in parallel at an interval of 3/2 of the first distance A.

Moreover, the position of each of the plurality of second source lines 35 in the x direction is the same as the second switch 42 of the memory unit 20 in a corresponding column. Each of the plurality of second source lines 35 is electrically connected to the second switches 42 of all of the memory units 20 in the corresponding column.

As described above, in the present embodiment, the plurality of memory units 20 are formed by the process as described above for the plurality of holes 51 arranged in the hexagonal closely packed structure in the insulating layer 50 using the anodic oxidation method. Thus, the magnetic storage device 10 according to the present embodiment may include the plurality of memory units 20 formed at a high density on the substrate.

(Example of Configuration in Case of Using Field Effect Transistor as First Switch 41 and Second Switch 42)

Descriptions will be made on a configuration in a case of using field effect transistors as the first switch 41 and the second switch 42.

Figure 23:
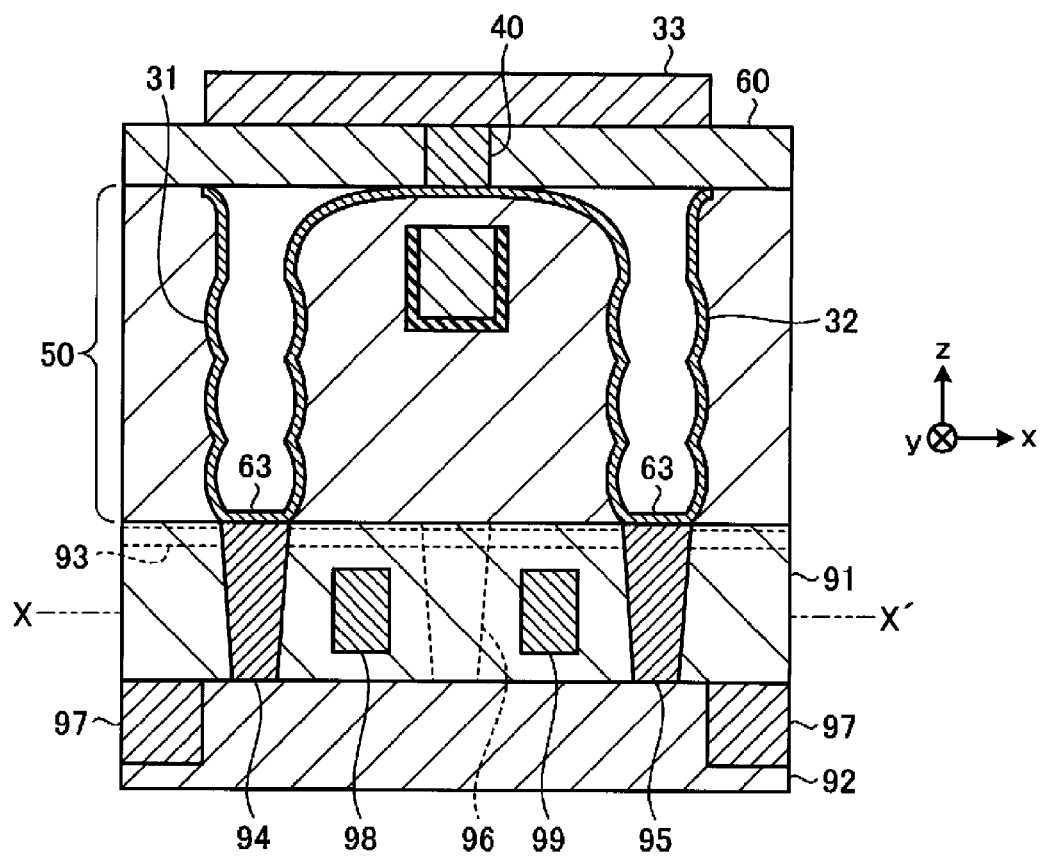
FIG. 23 is a cross-sectional view of field effect transistors as a first switch and a second switch.
Figure 24:
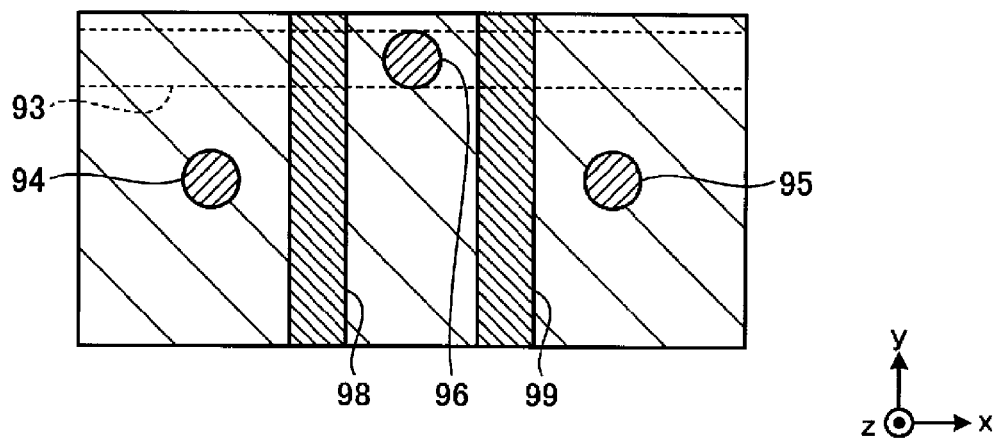
FIG. 24 is a cross-sectional view of the field effect transistors of FIG. 23 taken along line X-X'.

FIG. 23 is a cross-sectional view of the partial region 60 in a case of using field effect transistors as the first switch 41 and the second switch 42. FIG. 24 is a cross-sectional view of the partial region 60 taken along line X-X' of FIG. 23.

When a field effect transistor is used as the first switch 41 and the second switch 42, an insulating layer 91 is formed in a lower layer of the insulating layer 50. A channel layer 92 is further formed in a lower layer of the insulating layer 91.

Moreover, a wire 93 is formed between the insulating layer 50 and the insulating layer 91. The wire 93 is, for example, a straight line extending in the x direction. The wire 93 is formed at a position different from the first magnetic body 31 and the second magnetic body 32 in the y direction so as not to come into contact with the first magnetic body 31 and the second magnetic body 32. Then, the wire 93 is connected to a predetermined potential (e.g., a ground potential).

The insulating layer 91 includes a first interlayer electrode 94, a second interlayer electrode 95, and a third interlayer electrode 96. The first interlayer electrode 94 electrically interconnects the bottom portion 63 of the first magnetic body 31 and the channel layer 92. The second interlayer electrode 95 electrically interconnects the bottom portion 63 of the second magnetic body 32 and the channel layer 92. The third interlayer electrode 96 electrically interconnects the wire 93 and the channel layer 92.

A first select line 98 extends in the y direction in the insulating layer 91. The position in the x direction of the first select line 98 passes the region between the first interlayer electrode 94 and the third interlayer electrode 96. Moreover, the first select line 98 is provided so that an insulating film having a predetermined thickness is formed between the first select line 98 and the channel layer 92. Thus, the first select line 98 functions as a gate electrode in the field effect transistor. In addition, the first select line 98 is disposed in the same positional relationship as the first source line 34.

A second select line 99 extends in the y direction in the insulating layer 91. The position in the x direction of the second select line 99 passes the region between the second interlayer electrode 95 and the third interlayer electrode 96. Moreover, the second select line 99 is formed so as to form an insulating film having a predetermined thickness between the second select line 99 and the channel layer 92. Thus, the second select line 99 functions as a gate electrode in the field effect transistor. In addition, the second select line 99 is disposed in the same positional relationship as the second source line 35.

In the partial region 60 described above, the region between the first interlayer electrode 94 and the third interlayer electrode 96 in the channel layer 92, the first interlayer electrode 94, the third interlayer electrode 96, and the first select line 98 function as a field effect transistor which connects or disconnects between the bottom portion 63 of the first magnetic body 31 and the wire 93 of a predetermined potential.

In addition, in the partial region 60 described above, the region between the second interlayer electrode 95 and the third interlayer electrode 96 in the channel layer 92, the second interlayer electrode 95, the third interlayer electrode 96, and the second select line 99 function as a field effect transistor that connects or disconnects between the bottom portion 63 of the second magnetic body 32 and the wire 93 of a predetermined potential.

Moreover, the channel layer 92 includes a shallow trench isolation (STI) layer 97. The STI layer 97 insulates two field effect transistors formed in the partial region 60 from other field effect transistors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
    a magnetic body including first and second magnetic regions and a magnetic connection region that connects the first and second magnetic regions, and in which a plurality of magnetic domains each storing information by a magnetization direction thereof is formed;
    a read element that is electrically connected to the magnetic connection region and by which a magnetization direction of one of the magnetic domains is read;
    a write element by which a magnetic domain having a magnetization direction is formed in the magnetic body according to information to be stored;
    a first source line;
    a second source line;
    a first switch that electrically connects or disconnects an end of the first magnetic region opposite to the magnetic connection region and the first source line; and a second switch that electrically connects or disconnects an end of the second magnetic region opposite to the magnetic connection region and the second source line, wherein the magnetic domains formed in each of the first and second magnetic regions are shifted in a predetermined direction in response to current that flows through the corresponding one of the first and second magnetic regions.

2. The magnetic storage device according to claim 1, wherein each of the first and second magnetic regions has a cylindrical shape and contains ferromagnetic material.

3. The magnetic storage device according to claim 1, further comprising:

a bit line electrically connected to the read element.

4. The magnetic storage device according to claim 3, wherein the read element is a magnetoresistive element.

5. The magnetic storage device according to claim 1, wherein each of the first and second switches is an inter-terminal switch element that changes from an OFF state to an ON state when a voltage equal to or greater than a threshold voltage is applied between the bit line and the corresponding source line, and maintains the ON state as long as current equal to or greater than a holding current continues to flow through the switch.

6. The magnetic storage device according to claim 1, wherein the first and second switches are field effect transistors.

7. The magnetic storage device according to claim 1, wherein the first and second magnetic regions extend in a first direction and are arranged in parallel in a second direction intersecting the first direction, and an end of each of the first and second magnetic regions is bent along the second direction and is connected to the magnetic connection region.

8. The magnetic storage device according to claim 7, wherein the bit line extends in the second direction, and the first and second source lines extend in a third direction intersecting the first direction and the second direction.

9. The magnetic storage device according to claim 8, wherein the write element includes a field line extending in the third direction.

10. The magnetic storage device according to claim 1, wherein when the magnetic domain is formed by the write element in the magnetic body, a magnetic field is generated by current that flows through the write element.

11. The magnetic storage device according to claim 1, wherein the magnetic connection region is located between the read and write elements.

* * * * *